United States Patent
Tak et al.

(10) Patent No.: US 10,153,277 B2
(45) Date of Patent: Dec. 11, 2018

(54) INTEGRATED CIRCUIT DEVICE AND METHOD OF FABRICATING THE SAME

(71) Applicant: Samsung Electronics Co., Ltd., Suwon-si (KR)

(72) Inventors: Yong-suk Tak, Seoul (KR); Tae-jong Lee, Hwaseong-si (KR); Gi-gwan Park, Hwaseong-si (KR); Ji-myoung Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/390,361

(22) Filed: Dec. 23, 2016

(65) Prior Publication Data

US 2017/0221893 A1    Aug. 3, 2017

(30) Foreign Application Priority Data

Feb. 1, 2016    (KR) .................... 10-2016-0012449

(51) Int. Cl.
*H01L 29/66* (2006.01)
*H01L 29/06* (2006.01)
(Continued)

(52) U.S. Cl.
CPC ...... *H01L 27/0886* (2013.01); *H01L 21/0217* (2013.01); *H01L 21/823412* (2013.01); *H01L 21/823431* (2013.01); *H01L 21/823437* (2013.01); *H01L 21/823468* (2013.01); *H01L 21/823481* (2013.01); *H01L 27/0207* (2013.01); *H01L 27/088* (2013.01);
(Continued)

(58) Field of Classification Search
CPC ......... H01L 21/28132; H01L 21/28141; H01L 21/2815; H01L 21/823468; H01L 21/823437; H01L 21/823431; H01L 21/823481; H01L 21/823864; H01L 21/0217; H01L 29/0847; H01L 29/0665; H01L 29/0649; H01L 29/42376; H01L 29/66553; H01L 29/6656; H01L 29/66689; H01L 29/66719; H01L 29/7855–29/7856; H01L 27/0207; H01L 27/0886; H01L 29/1079; H01L 29/4232; H01L 29/4983
USPC .. 257/401, E21.64, 408, 288, 900, E21.409; 438/303, 595, 299, 410
See application file for complete search history.

(56) References Cited

U.S. PATENT DOCUMENTS 7,279,746 B2    10/2007 Doris et al.
8,039,342 B2    10/2011 Griebenow et al.
(Continued)

*Primary Examiner* — Natalia Gondarenko
(74) *Attorney, Agent, or Firm* — Muir Patent Law, PLLC

(57) ABSTRACT

An integrated circuit device includes: a pair of width-setting patterns over a substrate, the pair of width-setting patterns defining a width of a gate structure space in a first direction and extending in a second direction intersecting with the first direction. A gate electrode layer is provided that extends in the gate structure space along the second direction. A gate insulating layer is provided in the gate structure space and between the substrate and the gate electrode layer. An insulating spacer is provides on the pair of width-setting patterns, the insulating spacer covering both sidewalls of the gate electrode layer, wherein the pair of width-setting patterns have a carbon content that is greater than a carbon content of the insulating spacer.

14 Claims, 45 Drawing Sheets

(51) Int. Cl.
    *H01L 29/78*     (2006.01)
    *H01L 21/8234*     (2006.01)
    *H01L 27/088*     (2006.01)
    *H01L 21/02*     (2006.01)
    *H01L 27/02*     (2006.01)
    *H01L 29/08*     (2006.01)
    *H01L 29/423*     (2006.01)
    *H01L 21/8258*     (2006.01)

(52) U.S. Cl.
    CPC ...... *H01L 29/0649* (2013.01); *H01L 29/0665* (2013.01); *H01L 29/0847* (2013.01); *H01L 29/42376* (2013.01); *H01L 21/8258* (2013.01)

(56) References Cited

U.S. PATENT DOCUMENTS

| | | | |
|---|---|---|---|
| 8,084,311 B1 | 12/2011 | Horak et al. | |
| 8,697,557 B2 | 4/2014 | Baars et al. | |
| 8,796,127 B2 | 8/2014 | Kim et al. | |
| 8,928,048 B2 | 1/2015 | Xie et al. | |
| 9,136,356 B2 | 9/2015 | Lin et al. | |
| 9,159,798 B2 | 10/2015 | Wang et al. | |
| 9,337,094 B1 * | 5/2016 | Pranatharthiharan | H01L 21/76897 |
| 2008/0176390 A1 * | 7/2008 | Cheng | C23C 16/36 438/595 |
| 2011/0241128 A1 * | 10/2011 | O'Meara | H01L 21/28247 257/408 |
| 2012/0264279 A1 | 10/2012 | Lu et al. | |
| 2013/0183835 A1 * | 7/2013 | Nguyen | C23C 16/345 438/793 |
| 2013/0320414 A1 | 12/2013 | Fan et al. | |
| 2014/0377926 A1 * | 12/2014 | Kim | H01L 29/66795 438/289 |
| 2015/0235854 A1 | 8/2015 | Yin et al. | |
| 2015/0243604 A1 | 8/2015 | Xie et al. | |
| 2015/0303118 A1 | 10/2015 | Wang et al. | |
| 2016/0020110 A1 * | 1/2016 | Lu | H01L 29/7848 257/618 |

* cited by examiner

INTEGRATED CIRCUIT DEVICE AND METHOD OF FABRICATING THE SAME

CROSS-REFERENCE TO RELATED APPLICATION

This application claims the benefit of Korean Patent Application No. 10-2016-0012449, filed on Feb. 1, 2016, in the Korean Intellectual Property Office, the disclosure of which is incorporated herein in its entirety by reference.

FIELD OF TECHNOLOGY

The exemplary implementations described herein relate to an integrated circuit device and a method of fabricating the same, and more particularly, to an integrated circuit device including a field effect transistor and to a method of fabricating the same.

BACKGROUND

Recent rapid developments in electronic technology have led to the down-scaling of semiconductor devices. Since semiconductor devices require fast operation speeds and operation accuracy as well, various studies for optimizing the structures of down-scaled transistors included in the semiconductor devices are being carried out. In particular, as the size of a transistor is reduced the gate length may also be reduced but in order to maintain desired performance and suppress the occurrence of leakage currents, it is important to maintain a constant gate length.

SUMMARY

The exemplary implementations provide an integrated circuit device capable of improving the performance of a transistor by having a constant gate length along an extension direction of a gate electrode layer in the transistor having a fine size due to down-scaling.

The exemplary implementations also provide a method of fabricating an integrated circuit device, which allows an integrated circuit device to have a constant gate length along an extension direction of a gate electrode layer in order to improve the performance of a transistor having a fine size due to down-scaling.

According to an aspect of the exemplary implementations, there is provided an integrated circuit device, which includes: a pair of width-setting patterns over a substrate, the pair of width-setting patterns defining a width of a gate structure space in a first direction and extending in a second direction intersecting with the first direction; a gate electrode layer extending in the gate structure space along the second direction; a gate insulating layer in the gate structure space and between the substrate and the gate electrode layer; and an insulating spacer on the pair of width-setting patterns, the insulating spacer covering both sidewalls of the gate electrode layer, wherein the pair of width-setting patterns have a carbon content that is greater than a carbon content of the insulating spacer.

According to another aspect of the exemplary implementations, there is provided an integrated circuit device, which includes: a fin-type active region protruding from a substrate and extending in a first direction; a device isolation layer covering a lower sidewall of the fin-type active region; a pair of width-setting patterns on the fin-type active region and the device isolation layer, the pair of width-setting patterns defining a width of a gate structure space in the first direction and extending in a second direction intersecting with the first direction; a gate electrode layer covering a top surface and both sidewalls of the fin-type active region and extending in the gate structure space along the second direction; a gate insulating layer in the gate structure space and between the fin-type active region and the gate electrode layer; and an insulating spacer on the pair of width-setting patterns, the insulating spacer covering both sidewalls of the gate electrode layer, wherein the pair of width-setting patterns have a carbon content that is greater than a carbon content of the insulating spacer.

According to a further aspect of the exemplary implementations, there is provided an integrated circuit device, which includes: a fin-type active region protruding from a substrate and having a top surface that is at a first level; a nanosheet extending, at a second level, parallel to the top surface of the fin-type active region and having a channel area, the second level being spaced apart from the top surface of the fin-type active region; a pair of width-setting patterns on the fin-type active region, the pair of width-setting patterns defining a width of a gate structure space and extending in a direction intersecting with an extension direction of the fin-type active region; a gate extending in the gate structure space in a direction intersecting with the fin-type active region and surrounding at least a portion of the nanosheet; a gate insulating layer in the gate structure space and between the nanosheet and the gate, the gate insulating layer contacting the pair of width-setting patterns; a source/drain region on the fin-type active region, the source/drain region being connected to one end of the nanosheet; an insulating spacer on the pair of width-setting patterns, the insulating spacer covering a sidewall of the gate; and a second insulating spacer in a space between the top surface of the fin-type active region and the nanosheet, the second insulating spacer being interposed between the gate and the source/drain region, wherein the pair of width-setting patterns have a carbon content that is greater than a carbon content of the insulating spacer.

According to yet another aspect of the exemplary implementations, there is provided a method of fabricating an integrated circuit device, the method including: forming a pair of width-setting patterns over a substrate, the pair of width-setting patterns defining a width of a gate structure space in a first direction and extending in a second direction intersecting with the first direction; forming an insulating spacer on the pair of width-setting patterns; and forming a gate structure including a gate electrode layer in the gate structure space and a gate insulating layer in the gate structure space, the gate electrode layer extending along the second direction and having a sidewall facing the insulating spacer, and the gate insulating layer being interposed between the substrate and the gate electrode layer, wherein the pair of width-setting patterns have a carbon content that is greater than a carbon content of the insulating spacer.

The integrated circuit device according to the exemplary implementations includes a width-setting pattern defining a width of a gate structure space. The width-setting pattern allows a width of a space, in which a gate structure including a gate insulating layer is formed, to be maintained constant. Therefore, a gate length of the gate electrode layer is maintained constant, thereby improving the performance of a transistor.

BRIEF DESCRIPTION OF THE DRAWINGS

The exemplary implementations will be more clearly understood from the following detailed description taken in conjunction with the accompanying drawings in which:

FIG. 1A is a planar layout diagram showing a main configuration of an integrated circuit device, FIG. 1B is a perspective view showing an exemplary configuration of the integrated circuit device of FIG. 1A, FIG. 1C is a cross-sectional view of the integrated circuit device taken along a line C-C' of FIG. 1B, and FIG. 1D is a cross-sectional view of the integrated circuit device taken along a line D-D' of FIG. 1B;

FIG. 10A is a planar layout diagram of the integrated circuit device, FIG. 10B is a cross-sectional view of the integrated circuit device taken along a line X-X' of FIG. 10A, and FIG. 10C is a cross-sectional view of the integrated circuit device taken along a line Y-Y' of FIG. 10A;

DETAILED DESCRIPTION

Figure 1A:
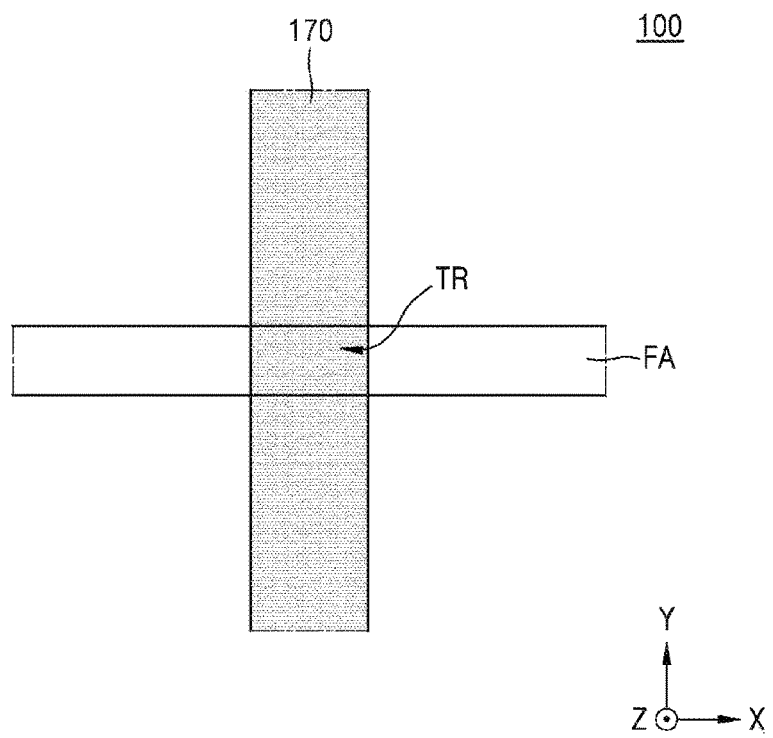
FIGS. 1A to 1D are diagrams for explaining an integrated circuit device according to exemplary implementations.

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary implementations, when taking the figures and their description as a whole into consideration.

Although the figures described herein may be referred to using language such as "one exemplary implementations," or "certain exemplary implementations," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary exemplary implementation.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary implementations described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As is traditional in the field of the disclosed technology, features and exemplary implementations are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary implementations may be physically separated into two or more interacting and discrete blocks, units and/or modules without departing from the scope of the inventive concepts. Further, the blocks, units and/or modules of the exemplary implementations may be physically combined into more complex blocks, units and/or modules without departing from the scope of the inventive concepts.

Figure 1B:
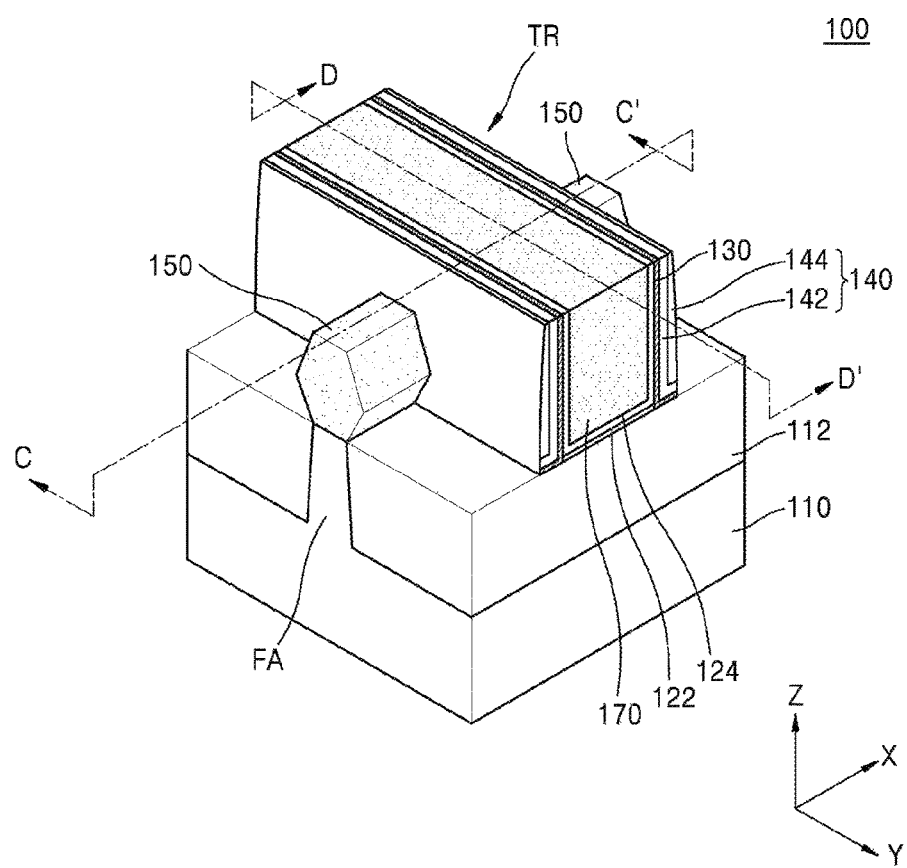
Figure 1C:
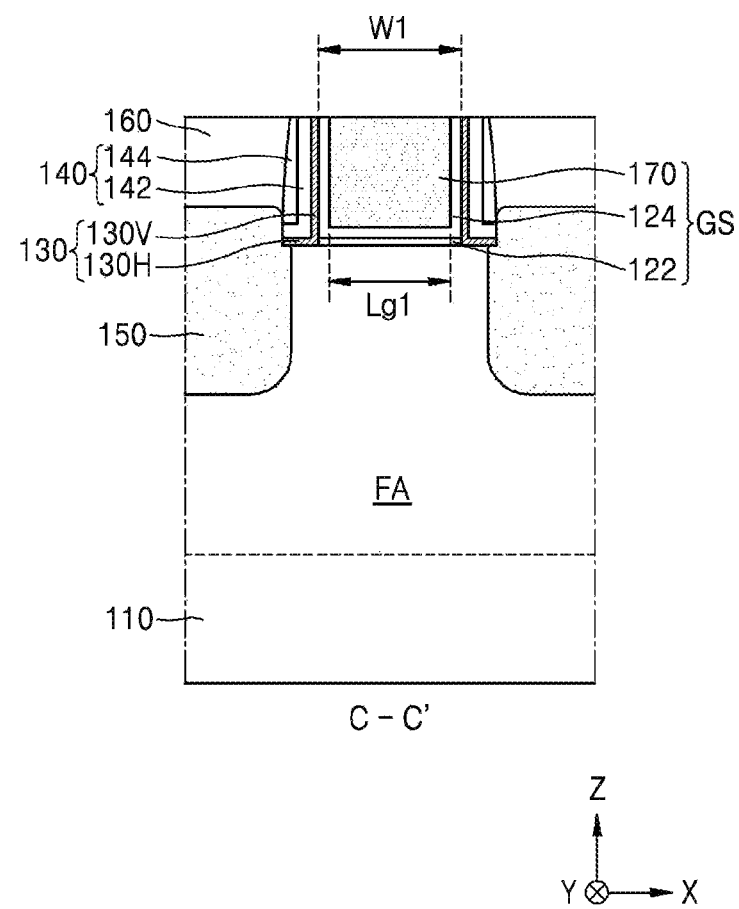
Figure 1D:
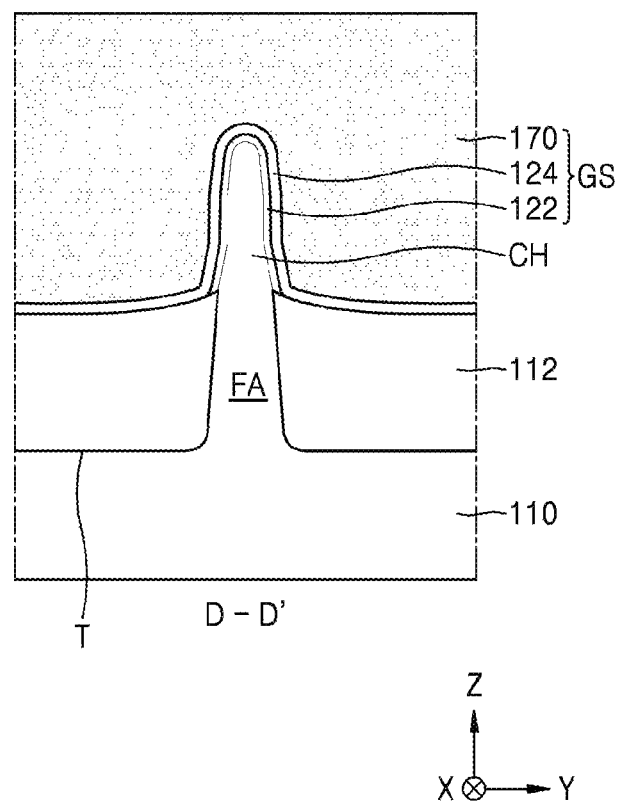

FIGS. 1A to 1D are diagrams for explaining an integrated circuit device according to exemplary implementations, FIG. 1A is a planar layout diagram showing a main configuration of an integrated circuit device, FIG. 1B is a perspective view showing an exemplary configuration of the integrated circuit device of FIG. 1A, that is, a perspective view showing main components of an integrated circuit device 100 including a transistor having a FinFET structure, FIG. 1C is a cross-sectional view of the integrated circuit device 100 taken along a line C-C' of FIG. 1B, and FIG. 1D is a cross-sectional view of the integrated circuit device 100 taken along a line D-D' of FIG. 1B.

As shown in FIGS. 1A to 1D, the integrated circuit device 100 includes a fin-type active region FA protruding from a substrate 110.

The substrate 110 may include a semiconductor such as Si or Ge, or a compound semiconductor such as SiGe, SiC, GaAs, InAs, or InP. In some exemplary implementations, the substrate 110 may include at least one of a Group III-V material and a Group IV material. The Group III-V material may be a binary, ternary, or quaternary compound including at least one Group III element and at least one Group V element. The Group III-V material may be a compound including at least one element of In, Ga, and Al as a Group III element and including at least one element of As, P, and Sb as a Group V element. For example, the Group III-V material may be selected from among InP, $In_zGa_{1-z}As$ (0≤z≤1), and $Al_zGa_{1-z}As$ (0≤z≤1). The binary compound may be, for example, one of InP, GaAs, InAs, InSb, and GaSb. The ternary compound may be, for example, one of InGaP, InGaAs, AlInAs, InGaSb, GaAsSb, and GaAsP. The Group IV material may be Si or Ge. However, the Group III-V material and the Group IV material, which may be used for the integrated circuit device according to the inventive concept, are not limited to the examples set forth above. The Group III-V material and the Group IV material such as Ge may be used as a channel material allowing a low-power high-speed transistor to be made. A high-performance CMOS may be formed by using a semiconductor substrate including a Group III-V material, for example, GaAs, which has a higher electron mobility than Si, and using a semiconductor substrate including a semiconductor material, for example, Ge, which has a higher hole mobility than Si. In some exemplary implementations, when an NMOS transistor is formed on the substrate 110, the substrate 110 may include one of the exemplary Group III-V materials set forth above. In some other exemplary implementations, when a PMOS transistor is formed on the substrate 110, at least a portion of the substrate 110 may include Ge. In another example, the substrate 110 may have a silicon-on-insulator (SOI) structure. The substrate 110 may include a conductive region, for example, an impurity-doped well, or an impurity-doped structure.

The fin-type active region FA may be defined by a trench T in the substrate 110. The fin-type active region FA may protrude from the substrate 110 in a direction (Z direction) perpendicular to a main plane of the substrate 110 and may extend on the substrate 110 along one direction (X direction in FIGS. 1A and 1B). A device isolation layer 112 is formed on the substrate 110 and covers a lower sidewall of the fin-type active region FA. The fin-type active region FA protrudes in a fin shape upwards from the device isolation layer 112.

The fin-type active region FA includes a channel area CH in an upper portion thereof. The lower sidewall of the fin-type active region FA is covered with the device isolation layer 112.

In some exemplary implementations, the channel area CH of the fin-type active region FA may include a single material. For example, all areas of the fin-type active region FA, including the channel area CH, may include Si. In some other exemplary implementations, some portions of the fin-type active region FA may include Ge, and the other portions of the fin-type active region FA may include Si.

The channel area CH of the fin-type active region FA is covered with an interfacial layer 122. A gate insulating layer 124 and a gate electrode layer 170 extend on the interfacial layer 122 in a direction (Y direction) intersecting with an extension direction of the fin-type active region FA, the gate insulating layer 124 and the gate electrode layer 170 covering both sidewalls and a top surface of the fin-type active region FA.

A transistor TR may be formed at a point at which the fin-type active region FA intersects with the gate electrode layer 170. The transistor TR includes a 3-dimensional-structured MOS transistor in which a channel is formed on the top surface and both sidewalls of the fin-type active region FA. The MOS transistor may constitute an NMOS transistor or a PMOS transistor.

In some exemplary implementations, the device isolation layer 112 may include a silicon-containing insulating layer, such as a silicon oxide layer, a silicon nitride layer, a silicon oxynitride layer, a silicon carbonitride layer, or the like, polysilicon, or combinations thereof. For example, the device isolation layer 112 may include a layer formed by a deposition process or a coating process. In some exemplary implementations, the device isolation layer 112 may include an oxide layer formed by a flowable chemical vapor deposition (FCVD) process or a spin coating process. For example, the device isolation layer 112 may include fluoride silicate glass (FSG), undoped silicate glass (USG), borophospho-silicate glass (BPSG), phospho-silicate glass (PSG), flowable oxide (FOX), plasma enhanced tetraethyl orthosilicate (PE-TEOS), or tonen silazene (TOSZ), without being limited thereto.

In some exemplary implementations, the interfacial layer 122 may be obtained by oxidizing a surface of the fin-type active region FA. The interfacial layer 122 may contact the fin-type active region FA. The interfacial layer 122 may cure interfacial defects between the fin-type active region FA and the gate insulating layer 124.

In some exemplary implementations, the interfacial layer 122 may include a low-K dielectric material layer having a dielectric constant of about 9 or less, for example, a silicon oxide layer, a silicon oxynitride layer, a Ga oxide layer, a Ge oxide layer, or combinations thereof. In some other exemplary implementations, the interfacial layer 122 may include a silicate, combinations of a silicate and a silicon oxide layer, or combinations of a silicate and a silicon oxynitride layer. In some exemplary implementations, the interfacial layer 122 may have a thickness of about 5 Å to about 20 Å, without being limited thereto. In some exemplary implementations, the interfacial layer 122 may be omitted.

The gate insulating layer 124 may include a material having a greater dielectric constant than the interfacial layer 122 and a silicon oxide layer. For example, the gate insulating layer 124 may have a dielectric constant of about 10 to about 25. The gate insulating layer 124 may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but a material constituting the gate insulating layer 124 is not limited to the examples set forth above. The gate insulating layer 124 may be formed by an atomic layer deposition (ALD) process, a chemical vapor deposition (CVD) process, or a physical vapor deposition (PVD) process. The gate insulating layer 124 may have a thickness of about 10 Å to about 40 Å, without being limited thereto.

The gate electrode layer 170 may include a metal-containing layer for adjusting work functions, and a metal-containing layer for gap-fill, which fills a space over the metal-containing layer for adjusting work functions. In some exemplary implementations, the gate electrode layer 170 may have a structure in which a metal nitride layer, a metal layer, a conductive capping layer, and a gap-fill metal layer are stacked in this stated order. Each of the metal nitride layer and the metal layer may include at least one metal selected from among Ti, W, Ru, Nb, Mo, Hf, Ni, Co, Pt, Yb, Tb, Dy, Er, and Pd. Each of the metal nitride layer and the metal layer may be formed by an ALD, metal organic ALD (MOALD), or metal organic CVD (MOCVD) process. The conductive capping layer may serve as a protective layer preventing oxidation of a surface of the metal layer. In addition, the conductive capping layer may serve as a wetting layer for facilitating deposition when another conductive layer is deposited on the metal layer. The conductive capping layer may include a metal nitride, for example, TiN, TaN, or combinations thereof, without being limited thereto. The gap-fill metal layer may extend on the conductive capping layer. The gap-fill metal layer may include a W layer. The gap-fill metal layer may be formed by an ALD, CVD, or PVD process. The gap-fill metal layer may fill a recess space without voids, the recess space being formed due to a step difference between areas in a top surface of the conductive capping layer. In some exemplary implementations, the gate electrode layer 170 may include a stacked structure of TiAlC/TiN/W, a stacked structure of TiN/TaN/TiAlC/TiN/W, or a stacked structure of TiN/TaN/TiN/TiAlC/TiN/W. In the stacked structures set forth above, a TiAlC layer or a TiN layer may serve as a metal-containing layer for adjusting work functions.

The interfacial layer 122, the gate insulating layer 124, and the gate electrode layer 170, which are stacked on the fin-type active region FA in this stated order, constitute a gate structure GS.

An insulating spacer 140 is formed over the fin-type active region FA and covers both sidewalls of the gate electrode layer 170.

In some exemplary implementations, the insulating spacer 140 includes a first insulating spacer 142 and a second insulating spacer 144, which are stacked on a side of the gate electrode layer 170 in this stated order in a direction away from the gate electrode layer 170.

A pair of width-setting patterns 130 are formed between both sidewalls of the gate electrode layer 170 and the insulating spacer 140. The insulating spacer 140 may be formed on the pair of width-setting patterns 130 to cover both sidewalls of the gate electrode layer 170.

In the integrated circuit device 100 shown in FIGS. 1A to 1D, the pair of width-setting patterns 130 may maintain a width W1 of a space for forming the gate structure GS constant, particularly, the width W1 of the space for forming the gate structure GS in the extension direction (X direction) of the fin-type active region FA, the gate structure GS including the interfacial layer 122, the gate insulating layer 124, and the gate electrode layer 170. The gate electrode layer 170 may have a gate length Lg1 along the extension direction (X direction) of the fin-type active region FA, the gate length Lg1 being less than the width W1 of the gate structure space. Since the width W1 of the space for forming the gate structure GS between the pair of width-setting patterns 130 is maintained constant, the gate length Lg1 of the gate electrode layer 170 may be maintained constant.

In some exemplary implementations, the first insulating spacer 142 of the insulating spacer 140 may include a silicon nitride layer. The second insulating spacer 144 may include a first carbon-containing insulating layer having a first carbon content. In some exemplary implementations, the first carbon-containing insulating layer constituting the second insulating spacer 144 may include a SiOCN layer, a SiCN layer, or combinations thereof. SiCN refers to a material containing silicon (Si), carbon (C), and nitrogen (N). SiOCN refers to a material containing silicon (Si), oxygen (O), carbon (C), and nitrogen (N).

The pair of width-setting patterns 130 may include a second carbon-containing insulating layer having a second carbon content that is greater than the first carbon content. In some exemplary implementations, the first carbon-containing insulating layer constituting the second insulating spacer 144 of the insulating spacer 140 may have a first carbon content selected from a range of about 5 atom % to about 15 atom %, and the second carbon-containing insulating layer constituting the pair of width-setting patterns 130 may have a second carbon content, which is selected from a range of about 10 atom % to about 25 atom % and is greater than the first carbon content. In some exemplary implementations, the pair of width-setting patterns 130 may include a SiOCN layer, a SiCN layer, or combinations thereof. In one exemplary implementation, the first carbon-containing insulating layer constituting the second insulating spacer 144 may include a SiOCN layer having a first carbon content selected from a range of about 5 atom % to about 15 atom %, and the second carbon-containing insulating layer constituting the pair of width-setting patterns 130 may include a SiOCN or SiCN layer having a second carbon content that is greater than the first carbon content.

In some exemplary implementations, the first carbon-containing insulating layer constituting the second insulating spacer 144 may include a SiOCN layer having a first oxygen content selected from a range of about 25 atom % to about 50 atom %, and the second carbon-containing insulating layer constituting the pair of width-setting patterns 130 may include a SiOCN layer, a SiCN layer, or combinations thereof having a second oxygen content that is less than the first oxygen content.

In the gate structure GS, the interfacial layer 122 and the gate insulating layer 124 may directly contact the pair of width-setting patterns 130.

The pair of width-setting patterns 130 may include a horizontally-extending portion 130H facing a bottom surface of the insulating spacer 140, and a vertically-extending portion 130V facing a sidewall of the gate electrode layer 170. The horizontally-extending portion 130H may extend along the extension direction (X direction) of the fin-type active region FA. The insulating spacer 140 may be spaced apart from the fin-type active region FA, with the horizontally-extending portion 130H being interposed between the insulating spacer 140 and the fin-type active region FA. The horizontally-extending portion 130H may contact the fin-type active region FA.

A pair of source/drain regions 150 may be formed on the fin-type active region FA on both sides of the gate electrode layer 170. The pair of source/drain regions 150 may include a semiconductor layer epitaxially grown on the fin-type active region FA. The pair of source/drain regions 150 may include an epitaxially grown Si layer, an epitaxially grown SiC layer, an embedded SiGe structure including a plurality of epitaxially grown SiGe layers, or the like.

An inter-gate dielectric 160 may be formed on both sides of the gate electrode layer 170 and cover the insulating spacer 140 and the pair of source/drain regions 150. The inter-gate dielectric 160 may be formed in the vicinity of the gate electrode layer 170 to cover the pair of source/drain regions 150. The inter-gate dielectric 160 may include a silicon oxide layer.

FIGS. 2A to 2L are cross-sectional views showing a method of fabricating an integrated circuit device according to a process order, according to exemplary implementations. An exemplary method of fabricating the integrated circuit device 100 shown in FIGS. 1A to 1D will be described with reference to FIGS. 2A to 2L. In FIGS. 2A to 2L, configurations respectively corresponding to the cross-section taken along the line C-C' of FIG. 1B and the cross-section taken along the line D-D' of FIG. 1B are shown according to a process order. In FIGS. 2A to 2L, the same reference numerals as in FIGS. 1A to 1D denote the same members, and descriptions thereof will be omitted.

Figure 2A:
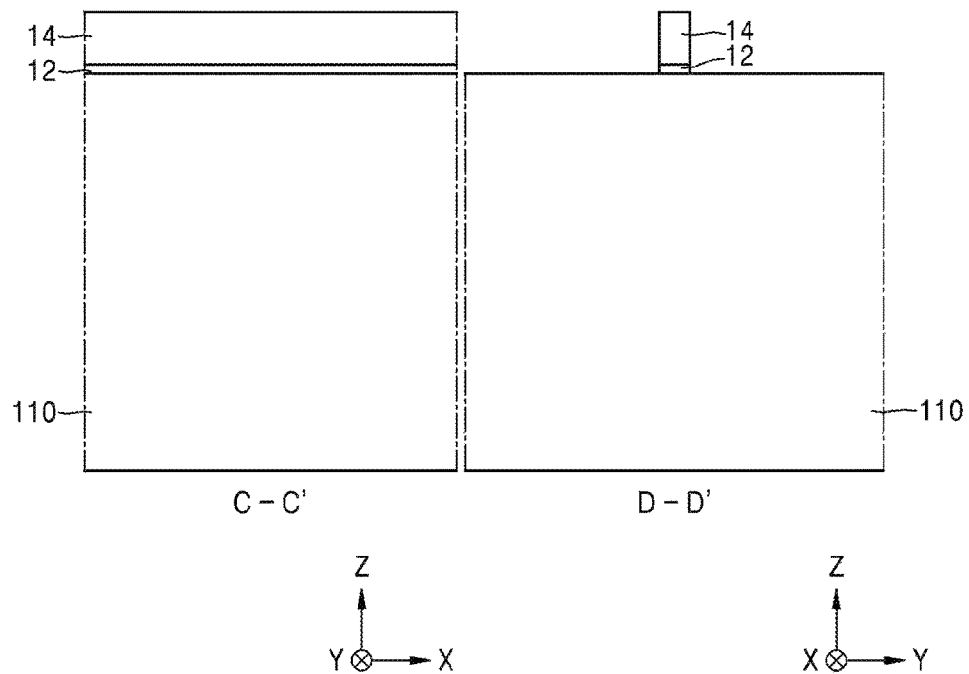
FIGS. 2A to 2L are cross-sectional views showing a method of fabricating an integrated circuit device according to a process order, according to exemplary implementations.

As shown in FIG. 2A, a plurality of pad oxide layer patterns 12 and a plurality of mask patterns 14 are formed over a substrate 110.

The plurality of pad oxide layer patterns 12 and the plurality of mask patterns 14 may extend parallel to each other over the substrate 110 along one direction (X direction).

In some exemplary implementations, the plurality of pad oxide layer patterns 12 may include an oxide layer obtained by thermally oxidizing a surface of the substrate 110. The plurality of mask patterns 14 may include a silicon nitride layer, a silicon oxynitride layer, a spin-on-glass (SOG) layer, a spin-on-hardmask (SOH) layer, a photoresist layer, or combinations thereof, without being limited thereto.

Figure 2B:
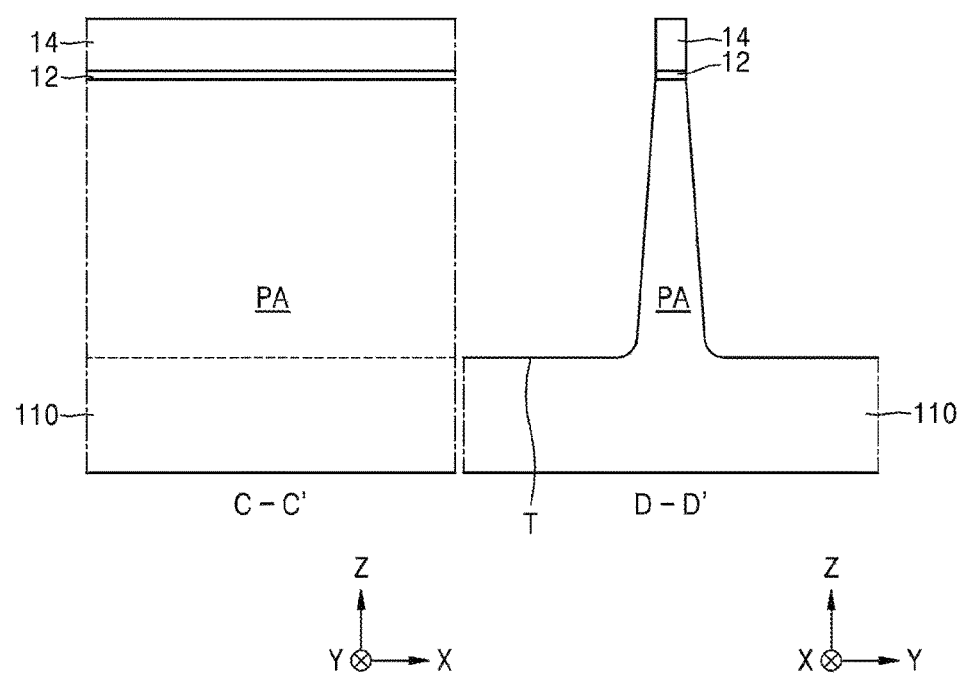

As shown in FIG. 2B, some regions of the substrate 110 may be etched by using the plurality of mask patterns 14 as an etch mask, thereby forming a plurality of trenches T in the substrate 110. As the plurality of trenches T are formed, a preliminary fin-type active region PA may be obtained, the preliminary fin-type active region PA protruding upwards along a direction (Z direction) perpendicular to a main plane of the substrate 110 and extending in one direction (X direction).

Figure 2C:
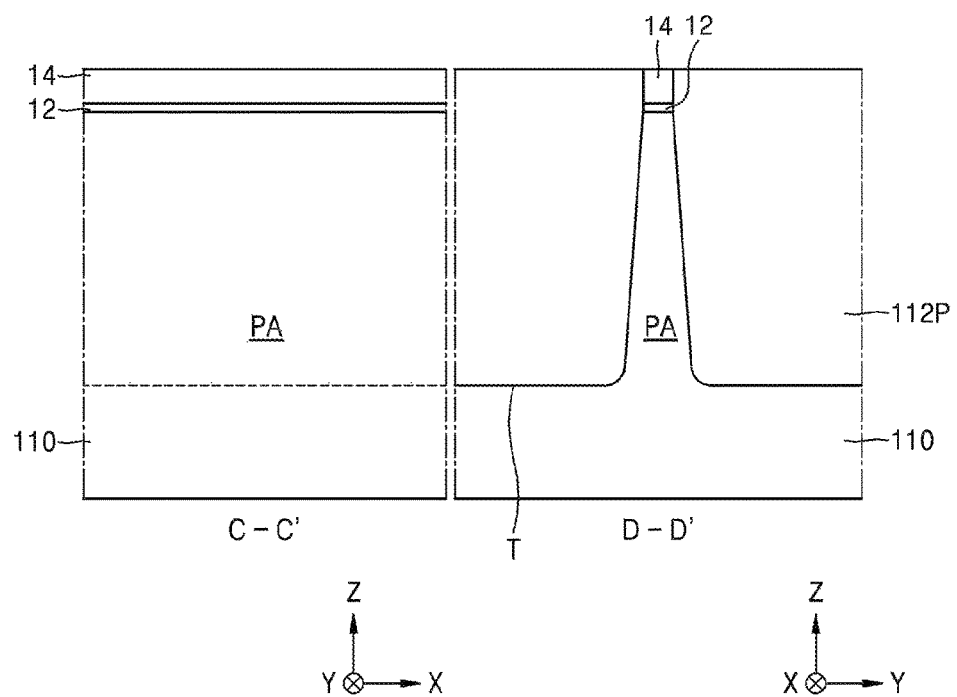

As shown in FIG. 2C, a preliminary device isolation layer 112P is formed in the vicinity of the preliminary fin-type active region PA and fills the plurality of trenches T.

To form the preliminary device isolation layer 112P, an insulating material, for example, an oxide, may be deposited to fill insides of the plurality of trenches T, followed by annealing the deposited insulating material.

The preliminary device isolation layer 112P may be formed by a FCVD process or a spin coating process. For example, the preliminary device isolation layer 112P may include FSG, USG, BPSG, PSG, FOX, PE-TEOS, or TOSZ.

The annealing process for forming the preliminary device isolation layer 112P may be performed by using a furnace or a rapid thermal processing (RTP) chamber. For example, the annealing may be performed at a temperature of about 700° C. to about 1100° C. for several seconds to several minutes by using an RTP chamber.

Figure 2D:
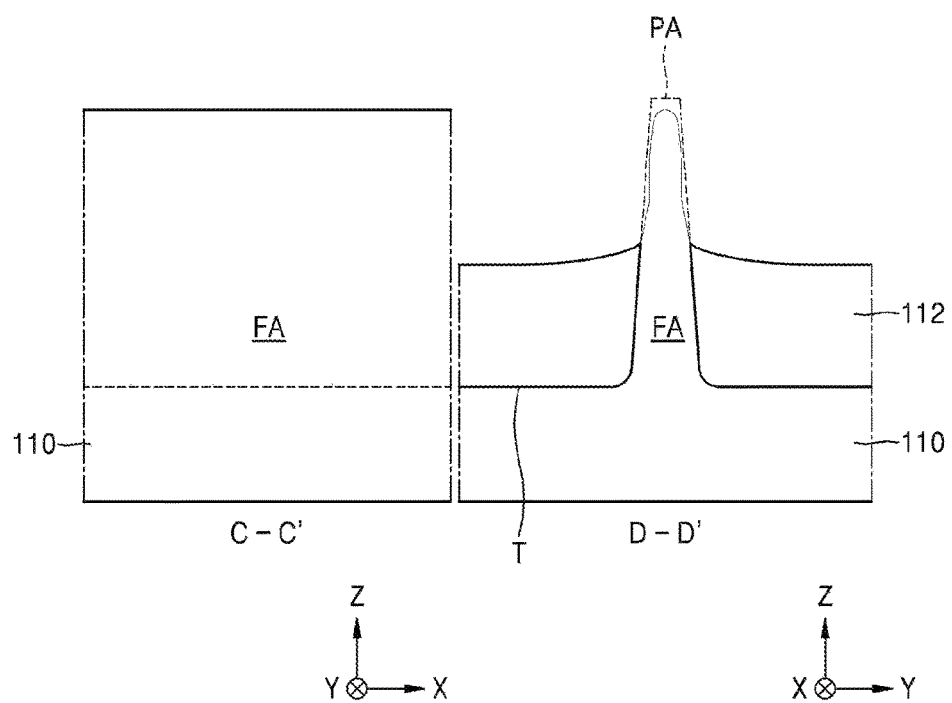

As shown in FIG. 2D, the plurality of mask patterns 14 and the plurality of pad oxide layer patterns 12 (see FIG. 2C), which cover the preliminary fin-type active region PA, are removed, and a recess process for removing an upper portion of the preliminary device isolation layer 112P is performed.

As a result, a device isolation layer 112 having a reduced height may be obtained, and a fin-type active region FA may be obtained from the preliminary fin-type active region PA.

When the plurality of mask patterns 14 include a silicon nitride layer, in order to remove the plurality of mask patterns 14, a wet etching process using an etchant, for example, $H_3PO_4$, may be performed. To remove the plurality of pad oxide layer patterns 12, a wet etching process, for example, using diluted HF (DHF), may be performed.

To perform the recess process on the preliminary device isolation layer 112P, a dry etching process, a wet etching process, or combinations thereof may be used. In some exemplary implementations, for the recess process of the preliminary device isolation layer 112P, a wet etching process using $NH_4OH$, tetramethylammonium hydroxide (TMAH), potassium hydroxide (KOH), or the like as an etchant, or a dry etching process, such as inductively coupled plasma (ICP) etching, transformer coupled plasma (TCP) etching, electron cyclotron resonance (ECR) plasma etching, reactive ion etching (ME), or the like, may be used. When the recess process of the preliminary device isolation layer 112P is performed by dry etching, a fluorine-containing gas such as $CF_4$, a chlorine-containing gas such as $Cl_2$, HBr, or the like may be used, without being limited thereto.

During the recess process, an upper portion of the preliminary fin-type active region PA may be exposed to an etching atmosphere such as plasma and/or to a subsequent cleaning atmosphere. As a result, the upper portion of the preliminary fin-type active region PA, which is exposed to etching, oxidation, and/or cleaning, may be partially consumed from an outer surface thereof, whereby the fin-type active region FA including an upper portion having a reduced width may be obtained, as shown in FIG. 2D.

In some exemplary implementations, the upper portion of the fin-type active region FA, which is exposed upwards from the device isolation layer 112, may be subjected to an implantation process of impurity ions for adjusting threshold voltages. During the implantation process of impurity ions for adjusting threshold voltages, boron (B) ions may be implanted as impurity ions into an area for forming an NMOS transistor, and phosphorus (P) or arsenic (As) ions may be implanted as impurity ions into an area for forming a PMOS transistor.

Figure 2E:
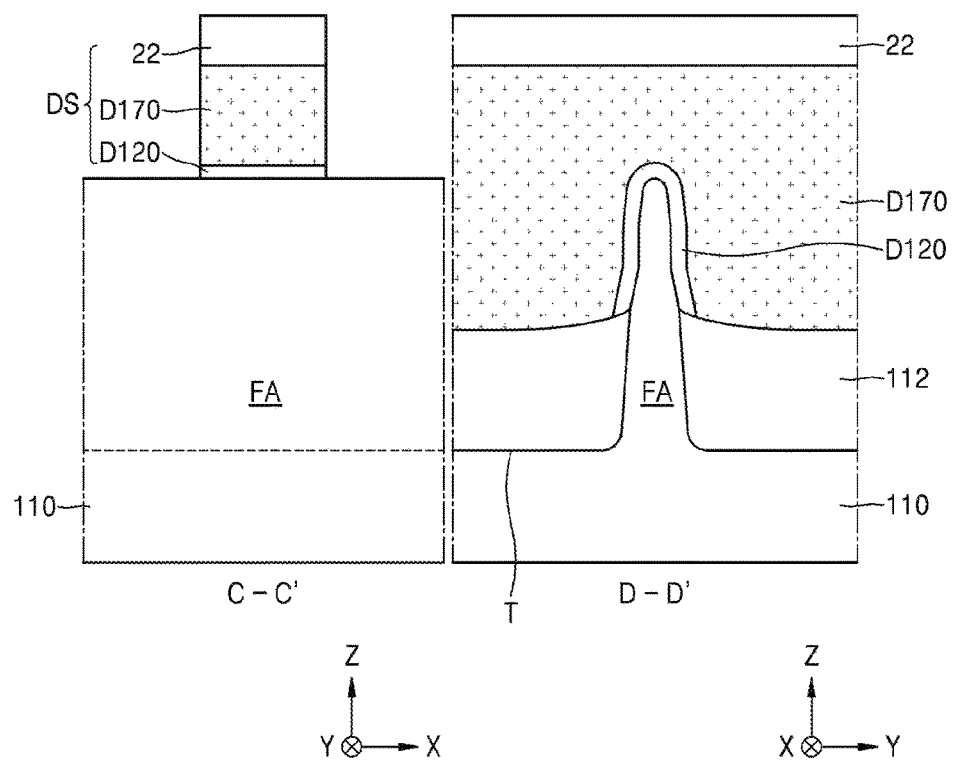

As shown in FIG. 2E, a dummy gate insulating layer D120 and a dummy gate electrode layer D170 are formed on the fin-type active region FA and the device isolation layer 112 on the substrate 110.

In some exemplary implementations, to form the dummy gate insulating layer D120 and the dummy gate electrode layer D170, the dummy gate insulating layer D120 and a preliminary dummy gate electrode layer may be formed over the substrate 110, and a mask pattern 22 may be formed on the preliminary dummy gate electrode layer, followed by etching the preliminary dummy gate electrode layer by using the mask pattern 22 as an etch mask.

The dummy gate insulating layer D120, the dummy gate electrode layer D170, and the mask pattern 22, which are formed on the fin-type active region FA in this stated order, constitute a dummy structure DS.

In some exemplary implementations, the dummy gate insulating layer D120 may include a silicon oxide layer, and the dummy gate electrode layer D170 may include polysilicon. However, the inventive concept is not limited thereto.

In some exemplary implementations, the dummy gate insulating layer D120 may be formed by a thermal oxidation process. In this case, as shown in FIG. 2E, the dummy gate insulating layer D120 may be formed only on a surface of the fin-type active region FA. In some other exemplary implementations, the dummy gate insulating layer D120 may be formed by a CVD or ALD process. In this case, unlike in the example shown in FIG. 2E, the dummy gate insulating layer D120 may extend to cover a top surface of the device isolation layer 112 as well as the surface of the fin-type active region FA.

The dummy gate electrode layer D170 may be formed by a CVD or ALD process.

Figure 2F:
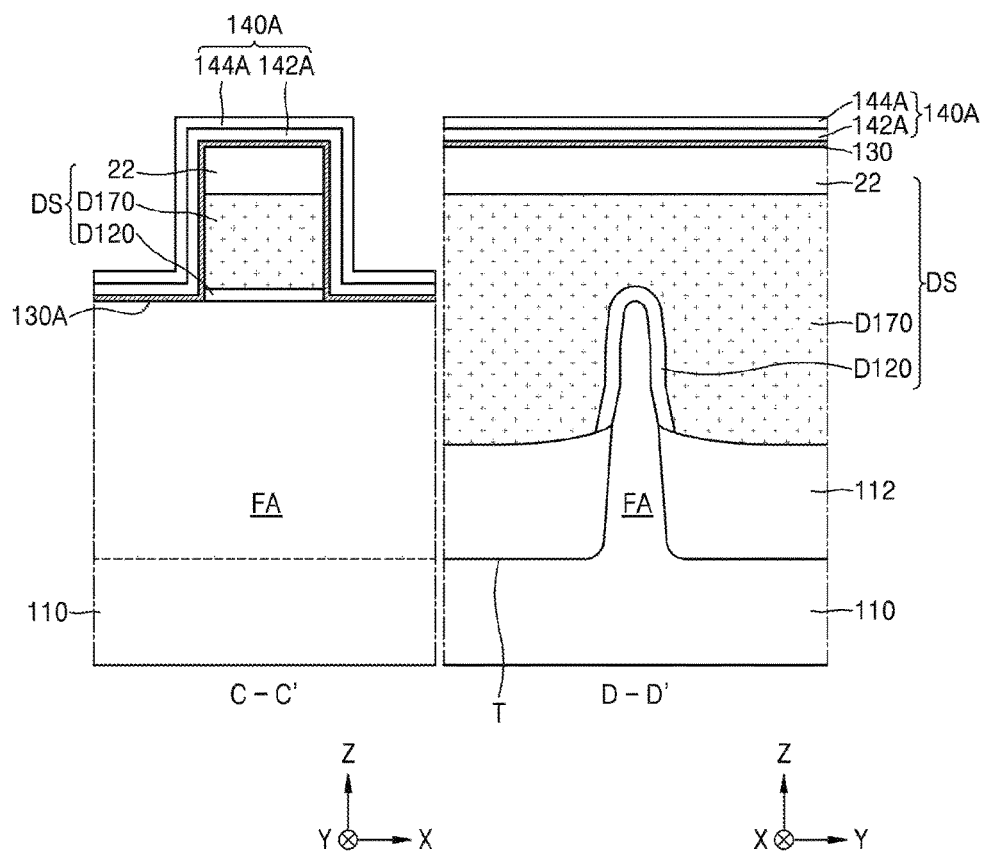

As shown in FIG. 2F, a width-setting layer 130A and an insulating layer 140A for spacers are formed over an entire surface of the substrate 110 in this stated order and cover both sidewalls of each of the dummy gate insulating layer D120 and the dummy gate electrode layer D170. The insulating layer 140A for spacers may include a first insulating layer 142A for spacers and a second insulating layer 144A for spacers, which are formed on the width-setting layer 130A in this stated order. In some exemplary implementations, the first insulating layer 142A for spacers may include a silicon nitride layer, and the second insulating layer 144A for spacers may include a SiOCN layer, a SiCN layer, or combinations thereof.

The width-setting layer 130A may include SiCN, SiOCN, or combinations thereof. However, the width-setting layer 130A may include a material having a carbon content that is greater than a carbon content of the second insulating layer 144A for spacers, which constitutes the insulating layer 140A for spacers.

In some exemplary implementations, to form the width-setting layer 130A, an ALD or CVD process may be used. For example, to form the width-setting layer 130A including SiCN, SiOCN, or combinations thereof, a plasma enhanced ALD (PEALD) process may be used. A deposition process for forming the width-setting layer 130A may be performed at a relatively low temperature of about 600° C. or less. The deposition process for forming the width-setting layer 130A may be performed at a low temperature of 500° C. or less depending upon a kind of a carbon precursor in use. For example, the deposition process for forming the width-setting layer 130A may be performed at a temperature of about 400° C. to about 450° C.

During an ALD process for forming the width-setting layer 130A, at least one selected from among a C1 to C10 alkane, a C2 to C10 alkene, a C1 to C15 alkylamine, a C4 to C15 nitrogen-containing heterocyclic compound, a C1 to C20 alkylsilane, a C1 to C20 alkoxysilane, and a C1 to C20 alkylsiloxane may be used as a carbon precursor.

The C1 to C10 alkane may include methane, ethane, propane, butane, pentane, hexane, heptane, octane, nonane, decane, or mixtures thereof.

The C2 to C10 alkene may include ethylene, propylene, butene, pentene, hexene, heptene, octene, nonene, decene, or mixtures thereof.

The C1 to C15 alkylamine may include monomethylamine, dimethylamine, trimethylamine, monoethylamine, diethylamine, triethylamine, monopropylamine, dipropylamine, tripropylamine, monobutylamine, dibutylamine, tributylamine, monopentylamine, dipentylamine, tripentylamine, monohexylamine, dihexylamine, monoheptylamine, diheptylamine, monooctylamine, mononоnylamine, monodecylamine, monoundecylamine, monododecylamine, monotridecylamine, monotetradecylamine, monopentadecylamine, dimethyl(ethyl)amine, dimethyl(propyl)amine, dimethyl(butyl)amine, dimethyl(pentyl)amine, dimethyl(hexyl)amine, dimethyl(heptyl)amine, dimethyl(octyl)amine, dimethyl(nonyl)amine, dimethyl(decyl)amine, dimethyl(undecyl)amine, dimethyl(dodecyl)amine, dimethyl(tridecyl)amine, diethyl(methyl)amine, diethyl(propyl)amine, diethyl(butyl)amine, diethyl(pentyl)amine, diethyl(hexyl)amine, diethyl(heptyl)amine, diethyl(octyl)amine, diethyl(nonyl)amine, diethyl(decyl)amine, diethyl(undecyl)amine, dipropyl(methyl)amine, dipropyl(ethyl)amine, dipropyl(butyl)amine, dipropyl(pentyl)amine, dipropyl(hexyl)amine, dipropyl(heptyl)amine, dipropyl(octyl)amine, dipropyl(nonyl)amine, dibutyl(methyl)amine, dibutyl(ethyl)amine, dibutyl(propyl)amine, dibutyl(pentyl)amine, dibutyl(hexyl)amine, dibutyl(heptyl)amine, dipentyl(methyl)amine, dipentyl(ethyl)amine, dipentyl(propyl)amine, dipentyl(butyl)amine, dihexyl(methyl)amine, dihexyl(ethyl)amine, dihexyl(propyl)amine, diheptyl(methyl)amine, dimethyl(butenyl)amine, dimethyl(heptenyl)amine, dimethyl(hexenyl)amine, dimethyl(heptenyl)amine, dimethyl(octenyl)amine, dimethyl(cyclopentyl)amine, dimethyl(cyclohexyl)amine, dimethyl(cycloheptyl)amine, bis(methyl cyclopentyl)amine, (dimethyl cyclopentyl)amine, bis(dimethyl cyclopentyl)amine, (ethyl cyclopentyl)amine, bis(ethylcyclopentyl)amine, (methylethyl cyclopentyl)amine, bis (methylethyl cyclopentyl)amine, N-methyl ethylenediamine, N-ethyl ethylenediamine, N-propyl ethylenediamine, N-butyl ethylenediamine, N-pentyl ethylenediamine, N-hexyl ethylenediamine, N-heptyl ethylenediamine, N-octyl ethylenediamine, N-nonyl ethylenediamine, N-decyl ethylenediamine, N-undecyl ethylenediamine, N-dodecyl ethylenediamine, or the like.

The C1 to C20 alkylsilane may include methylsilane, tetramethylsilane (TMS), tetraethylsilane (TES), tetrapropylsilane, tetrabutylsilane, dimethylsilane (DMS), diethylsilane (DES), dimethyldifluorosilane (DMDFS), dimethyldichlorosilane (DMDCS), diethyldichlorosilane (DEDCS), hexamethyldisilane, dodecamethylcyclohexasilane, dimethyldiphenylsilane, diethyldiphenylsilane, methyltrichlorosilane, methyltriphenylsilane, dimethyldiethylsilane, or the like.

The C1 to C20 alkoxysilane may include trimethoxysilane, dimethoxysilane, methoxysilane, methyldimethoxysilane, diethoxymethylsilane, dimethylethoxysilane, dimethylaminomethoxysilane, dimethylmethoxysilane, methyltrimethoxysilane, dimethyldimethoxysilane, phenyltrimethoxysilane, diphenyldimethoxysilane, diphenyldiethoxysilane, triphenylmethoxysilane, triphenylethoxysilane, or the like.

The C1 to C20 alkylsiloxane may include hexamethylcyclotrisiloxane, tetramethylcyclotetrasiloxane, tetraethylcyclotetrasiloxane, octamethylcyclotetrasiloxane, hexamethyldisiloxane, or the like.

During the ALD process for forming the width-setting layer 130A, an oxygen reactant may be used. The oxygen reactant may include $O_3$, $H_2O$, $O_2$, $NO_2$, $NO$, $N_2O$, $H_2O$, alcohol, a metal alkoxide, plasma $O_2$, remote plasma $O_2$, plasma $N_2O$, plasma $H_2O$, or combinations thereof.

During the ALD process for forming the width-setting layer 130A, a nitrogen reactant may be used. The nitrogen reactant may include $N_2$, $NH_3$, hydrazine ($N_2H_4$), plasma $N_2$, remote plasma $N_2$, or combinations thereof.

In some exemplary implementations, when the width-setting layer 130A includes SiCN or SiOCN, a precursor, which includes a compound including both of a silicon atom and a carbon atom, may be used instead of respectively using separate precursors as a silicon precursor and a carbon precursor, during the ALD process for forming the width-setting layer 130A.

To form the insulating layer 140A for spacers, an ALD or CVD process may be used. In particular, to form the second insulating layer 144A for spacers, which includes SiCN, SiOCN, or combinations thereof, a PEALD process may be used. A deposition process for forming the second insulating layer 144A for spacers may be performed by a process that is mostly similar to the process of forming the width-setting layer 130A. However, the second insulating layer 144A for spacers may have less carbon content than the width-setting layer 130A.

In some exemplary implementations, when the second insulating layer 144A for spacers, which constitutes the insulating layer 140A for spacers, includes SiCN or SiOCN, different precursors may be respectively used as the silicon precursor and the carbon precursor, during an ALD process for forming the insulating layer 140A for spacers. In this case, materials capable of being respectively used as the silicon precursor and the carbon precursor are the same as the examples set forth above.

An ALD process for forming the second insulating layer 144A for spacers, which constitutes the insulating layer 140A for spacers, may be performed at a relatively low temperature of about 600° C. or less, for example, a low temperature of about 450° C. or less. In some exemplary implementations, a temperature for forming the width-setting layer 130A may be lower than a temperature for forming the second insulating layer 144A for spacers. The ALD process for forming the width-setting layer 130A may be performed at a low temperature of about 450° C. or less, and the ALD process for forming the second insulating layer 144A for spacers may be performed at a temperature of about 600° C. or less. For example, the width-setting layer 130A may be formed at a process temperature of about 400° C. to about 450° C., and the second insulating layer 144A for spacers may be formed at a process temperature of about 600° C. to about 650° C.

Figure 2G:
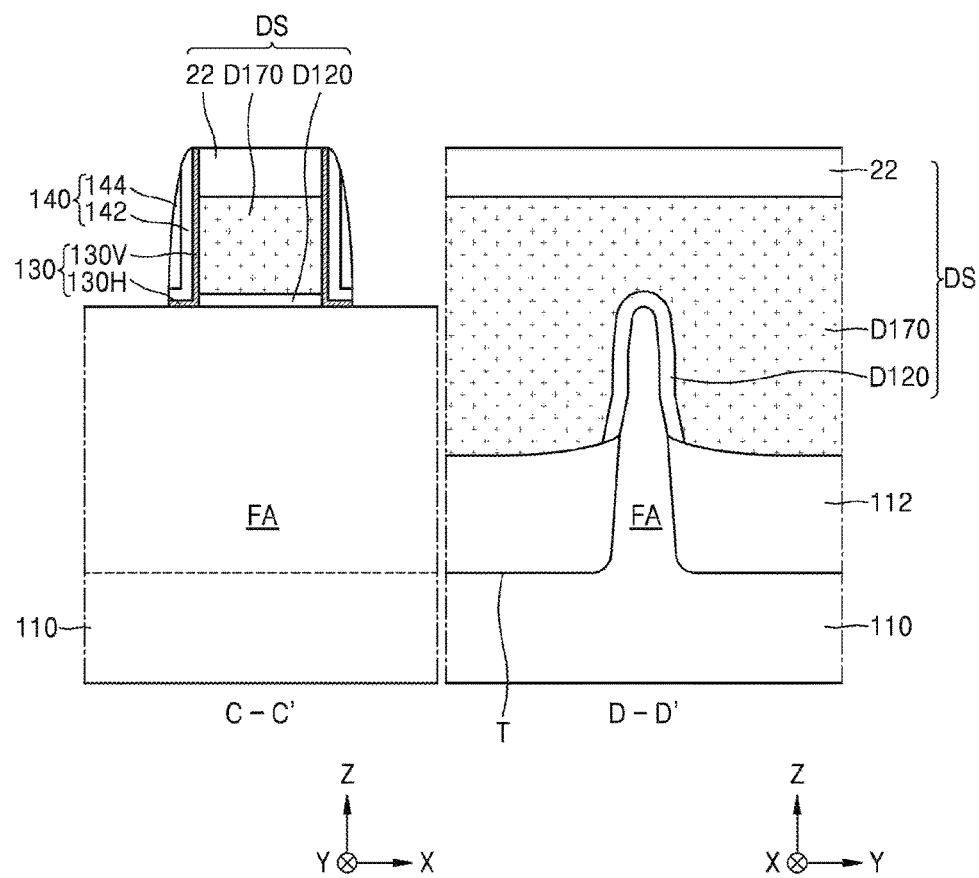

As shown in FIG. 2G, the width-setting layer 130A and the second insulating layer 144A for spacers are subjected to etch-back, thereby forming a width-setting pattern 130 and an insulating spacer 140 on both sidewalls of the dummy structure DS.

The width-setting pattern 130 may include a horizontally-extending portion 130H facing a bottom surface of the insulating spacer 140, and a vertically-extending portion 130V covering a sidewall of the dummy structure DS.

Figure 2H:
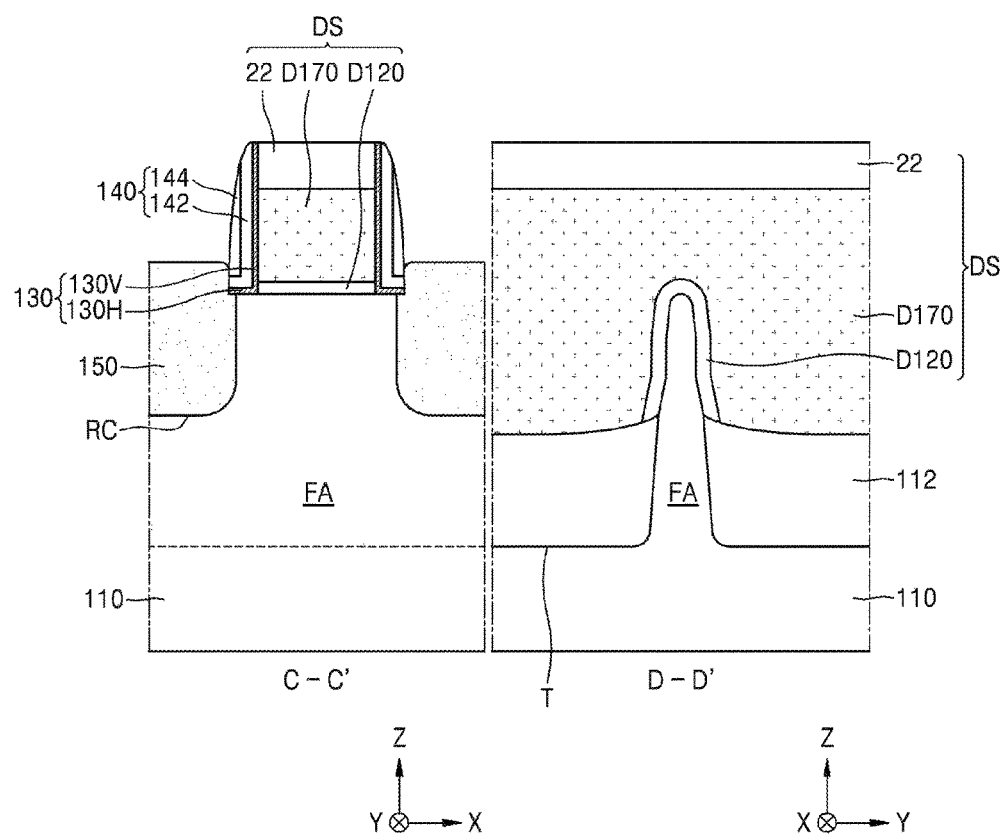

As shown in FIG. 2H, a recess space RC is formed by partially removing the fin-type active region FA on both sides of the dummy structure DS, and then, a pair of source/drain regions 150 are formed to fill the recess space RC.

In some exemplary implementations, an etching process for forming the recess space RC may be performed in-situ together with the etch-back process of the second insulating layer 144A for spacers in order to form the insulating spacer 140.

In an exemplary process of forming the pair of source/drain regions 150, a selective epitaxial growth (SEG) process using a surface of the fin-type active region FA as a seed may be performed, the surface of the fin-type active region FA being exposed in the recess space RC. Thus, the pair of source/drain regions 150 may include a semiconductor layer epitaxially grown on the fin-type active region FA. For example, the pair of source/drain regions 150 may include an epitaxially grown Si layer, an epitaxially grown SiC layer, or an embedded SiGe structure including a plurality of epitaxially grown SiGe layers.

In some exemplary implementations, to form the pair of source/drain regions 150, a single-crystal silicon-germanium (SiGe) layer may be formed by performing an SEG process by using a silicon source gas such as dichlorosilane ($SiH_2Cl_2$) and using a germanium source gas such as germanium tetrahydride ($GeH_4$). Here, a single-crystal SiGe layer doped with P-type impurities may be formed in at least a portion of the pair of source/drain regions 150 by using a P-type impurity source gas, for example, diborane ($B_2H_6$) gas, or the like, together with the silicon source gas and the germanium source gas.

The pair of source/drain regions 150 may be formed to fill the recess space RC, and a portion of the pair of source/drain regions 150 may contact a portion of the insulating spacer 140.

Figure 2I:
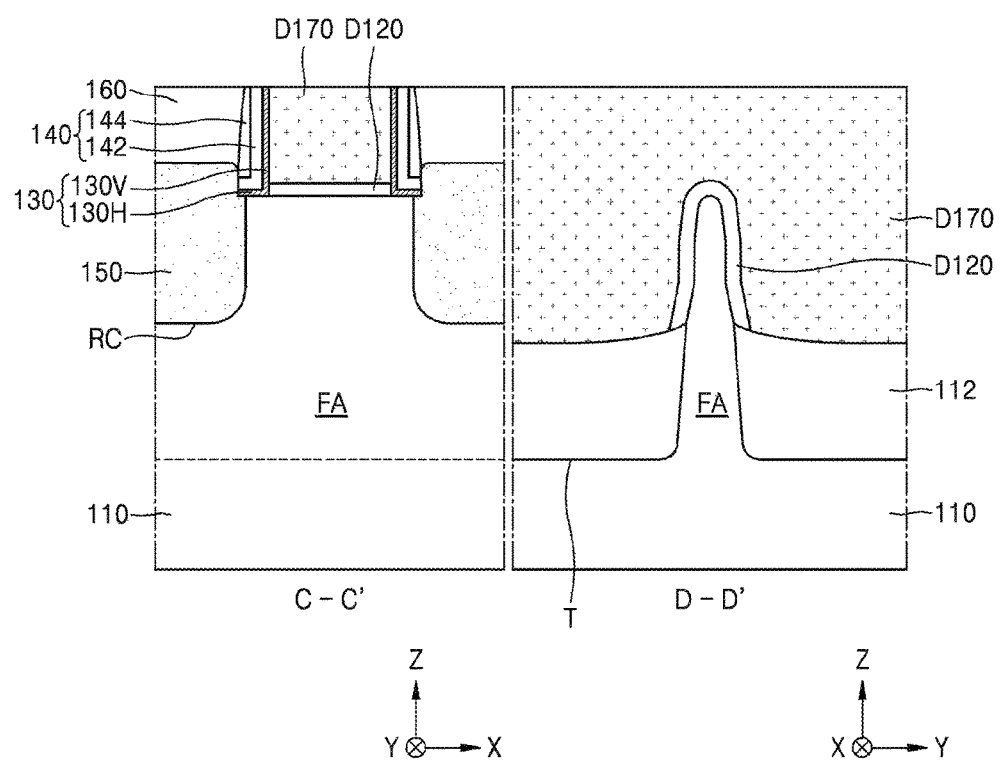

As shown in FIG. 2I, an inter-gate dielectric 160 is formed on both sides of the dummy structure DS (see FIG. 2H) to cover the pair of source/drain regions 150 and the insulating spacer 140, and then, a result product including the inter-gate dielectric 160 is planarized by a CMP process or an etch-back process so that a top surface of the dummy gate electrode layer D170 is exposed.

During the planarization of the result product including the inter-gate dielectric 160, the mask pattern 22 of the dummy structure DS, an upper portion of the insulating spacer 140, and an upper portion of the width-setting pattern 130 may be removed.

Figure 2J:
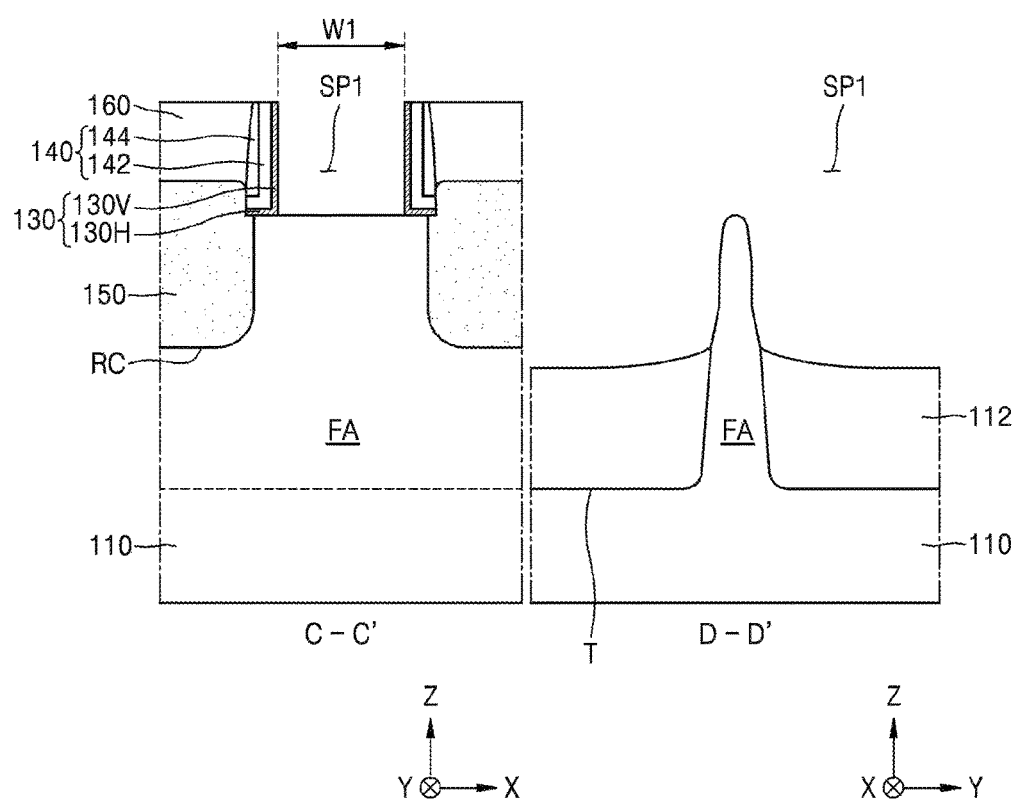

As shown in FIG. 2J, a gate structure space SP1 is prepared by removing the dummy gate electrode layer D170 and the underlying dummy gate insulating layer D120.

A width W1 of the gate structure space SP1 may be defined in the extension direction (X direction) of the fin-type active region FA by a pair of width-setting patterns 130. A top surface of the fin-type active region FA may be exposed by the gate structure space SP1.

A wet etching process may be performed to remove the dummy gate electrode layer D170 and the underlying dummy gate insulating layer D120 from the result product of FIG. 2I. To perform the wet etching process, an etching solution including, for example, nitric acid ($HNO_3$), diluted fluoric acid (DHF), $NH_4OH$, TMAH, KOH, or combinations thereof, may be used, without being limited thereto.

During the wet etching process for removing the dummy gate electrode layer D170 and the dummy gate insulating layer D120 are removed by the etching solution, the pair of width-setting patterns 130 defining the width W1 of the gate structure space SP1 may be exposed to the etching solution. Since the pair of width-setting patterns 130 includes a material having relatively high carbon content, the pair of width-setting patterns 130 have excellent resistance with respect to the etching solution. Therefore, even though exposed to the etching solution, the pair of width-setting patterns 130 may intactly remain without being consumed by the etching solution. Therefore, the width W1 of the gate structure space SP1 may be maintained constant.

Figure 2K:
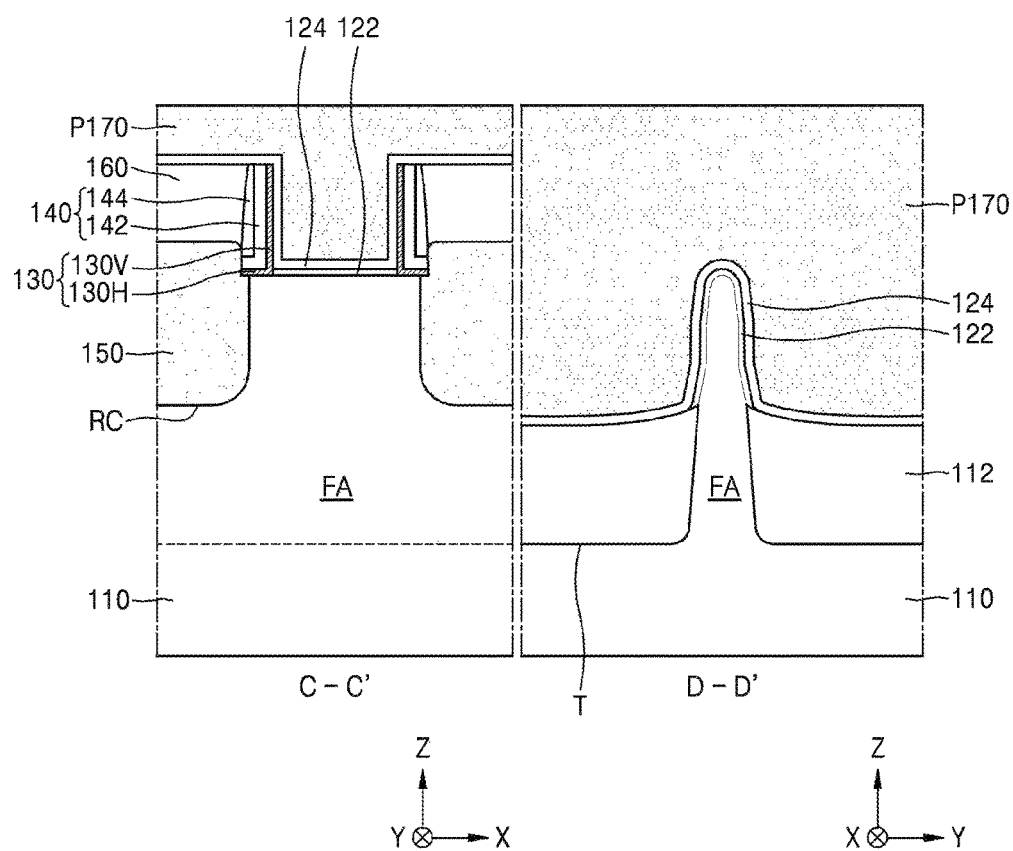

As shown in FIG. 2K, an interfacial layer 122 and a gate insulating layer 124 are formed on a surface of the fin-type active region FA exposed by the gate structure space SP1 (see FIG. 2J), and a preliminary gate electrode layer P170 is formed on the gate insulating layer 124 and fills the gate structure space SP1.

For example, the interfacial layer 122 may have a thickness of about 5 Å to about 20 Å. The interfacial layer 122 may be formed by a thermal oxidation, ALD, CVD, or PVD process.

The gate insulating layer 124 may be formed in the gate structure space SP1 to conformally cover the pair of width-setting patterns 130 and the interfacial layer 122. The gate insulating layer 124 may include a material having a dielectric constant of about 10 to about 25. The gate insulating layer 124 may be formed by an ALD, CVD, or PVD process. The gate insulating layer 124 may have a thickness of about 10 Å to about 40 Å, without being limited thereto.

To form the preliminary gate electrode layer P170, an ALD, MOALD, or MOCVD process may be used.

Figure 2L:
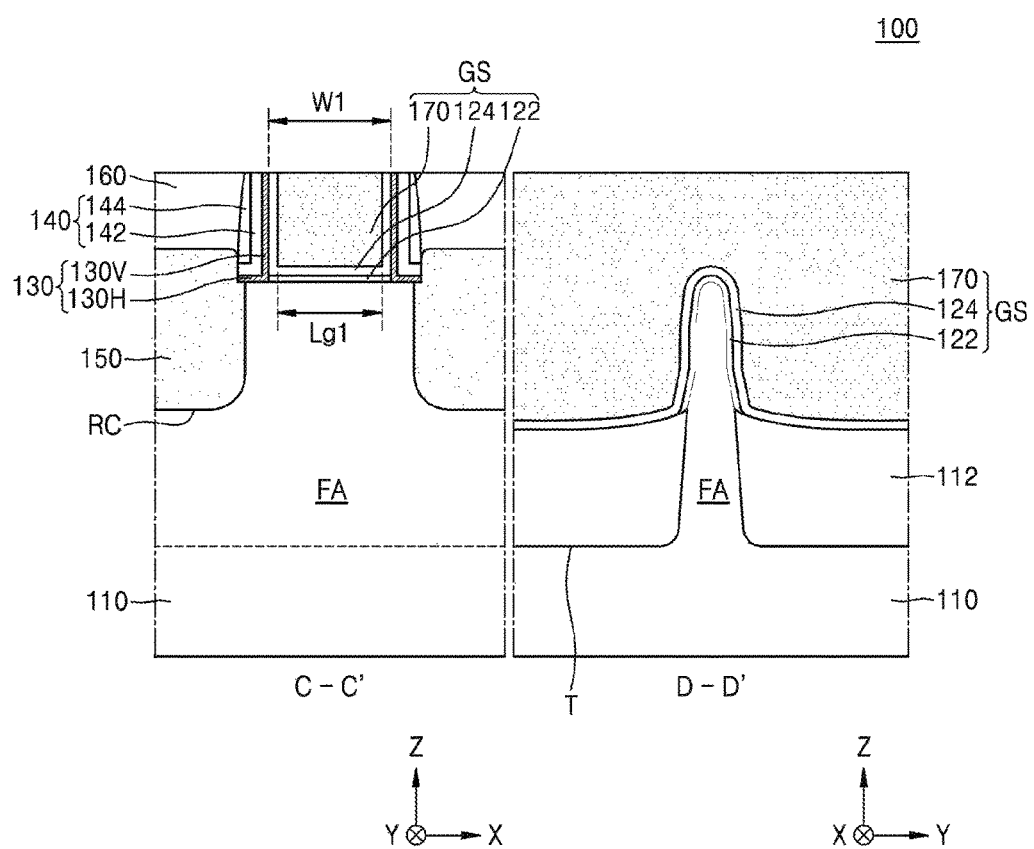

As shown in FIG. 2L, a planarization process for removing a portion of the preliminary gate electrode layer P170, a portion of the gate insulating layer 124, and a portion of the pair of width-setting patterns 130 is performed so that the inter-gate dielectric 160 is exposed, thereby forming a gate electrode layer 170 in the gate structure space SP1.

According to the method of fabricating the integrated circuit device 100, which has been described with reference to FIGS. 2A to 2L, since the width W1 of the gate structure space SP1, in which the gate electrode layer 170 is formed, is maintained constant by the pair of width-setting patterns 130, a gate length Lg1 of the gate electrode layer 170 may be maintained constant.

Figure 3:
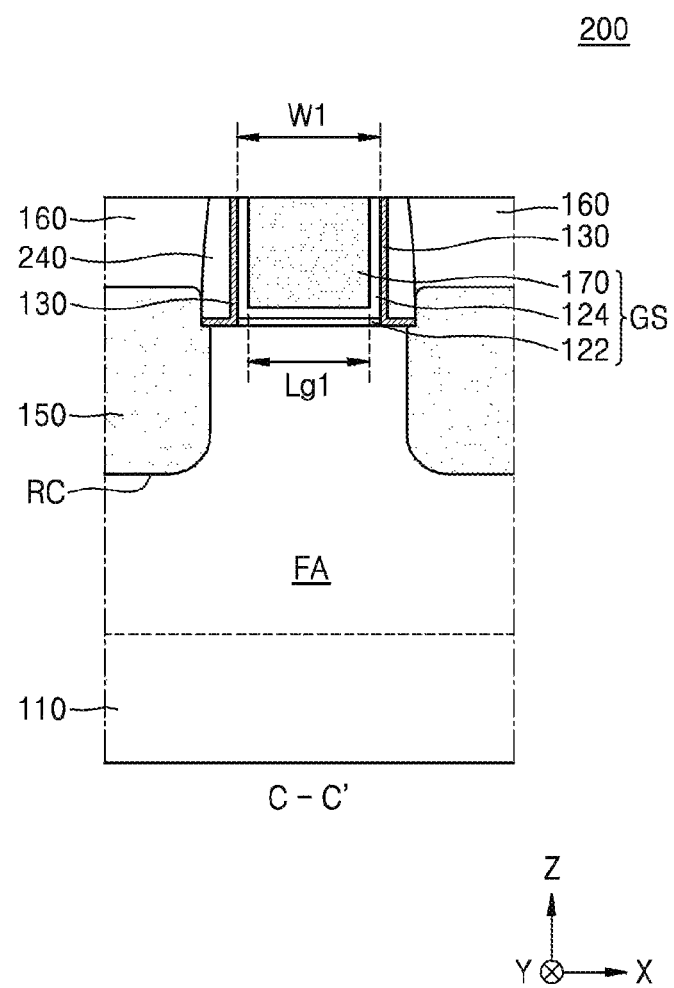
FIG. 3 is a cross-sectional view for explaining an integrated circuit device according to other exemplary implementations.

FIG. 3 is a cross-sectional view for explaining an integrated circuit device according to other exemplary implementations. FIG. 3 shows a cross-sectional view of the integrated circuit device, which corresponds to the cross-section taken along the line C-C' of FIG. 1B. In FIG. 3, the same reference numerals as in FIGS. 1A to 1D denote the same members, and descriptions thereof will be omitted.

As shown in FIG. 3, an integrated circuit device 200 has substantially the same configuration as the integrated circuit device 100 shown in FIGS. 1A to 1D. However, the pair of width-setting patterns 130 are formed on the fin-type active region FA and on both sidewalls of the gate electrode layer 170, and an insulating spacer 240 including a single layer is formed on the pair of width-setting patterns 130.

The insulating spacer 240 may include a first carbon-containing insulating layer having a first carbon content. In some exemplary implementations, the first carbon-containing insulating layer constituting the insulating spacer 240 may include a SiOCN layer, a SiCN layer, or combinations thereof. The first carbon-containing insulating layer constituting the insulating spacer 240 may have less carbon content than the second carbon-containing insulating layer constituting the pair of width-setting patterns 130. The insulating spacer 240 may have the same configuration as the second insulating spacer 144 of the insulating spacer 140, which has been described with reference to FIGS. 1A to 1D.

As shown in FIG. 3, to form the integrated circuit device 200 including the insulating spacer 240 having a single layer, similar processes to the fabrication processes of the integrated circuit device, which have been described with reference to FIGS. 2A to 2L, may be performed. However, a preliminary spacer layer for forming the insulating spacer 240 having a single layer may be formed instead of the insulating layer 140A which includes layers 142A and 144A and is described with reference to FIG. 2F. Next, in a similar method to the method described with reference to FIG. 2G, the insulating spacer 240 may be formed by performing etch-back of the preliminary spacer layer. Next, the integrated circuit device 200 shown in FIG. 3 may be fabricated by performing the processes described with reference to FIGS. 2H to 2L.

In the integrated circuit device 200 shown in FIG. 3, the pair of the width-setting patterns 130 may maintain the width W1 of the space for forming the gate structure GS constant, particularly, the width W1 of the space for forming the gate structure GS in the extension direction (X direction) of the fin-type active region FA, the gate structure GS including the interfacial layer 122, the gate insulating layer 124, and the gate electrode layer 170. The gate electrode layer 170 may have a gate length Lg1 that is less than the width W1 of the gate structure space, along the extension direction (X direction) of the fin-type active region FA. Since the width W1 of the space for forming the gate structure GS between the pair of the width-setting patterns 130 is maintained constant, the gate length Lg1 of the electrode layer 170 may be maintained constant.

Figure 4:
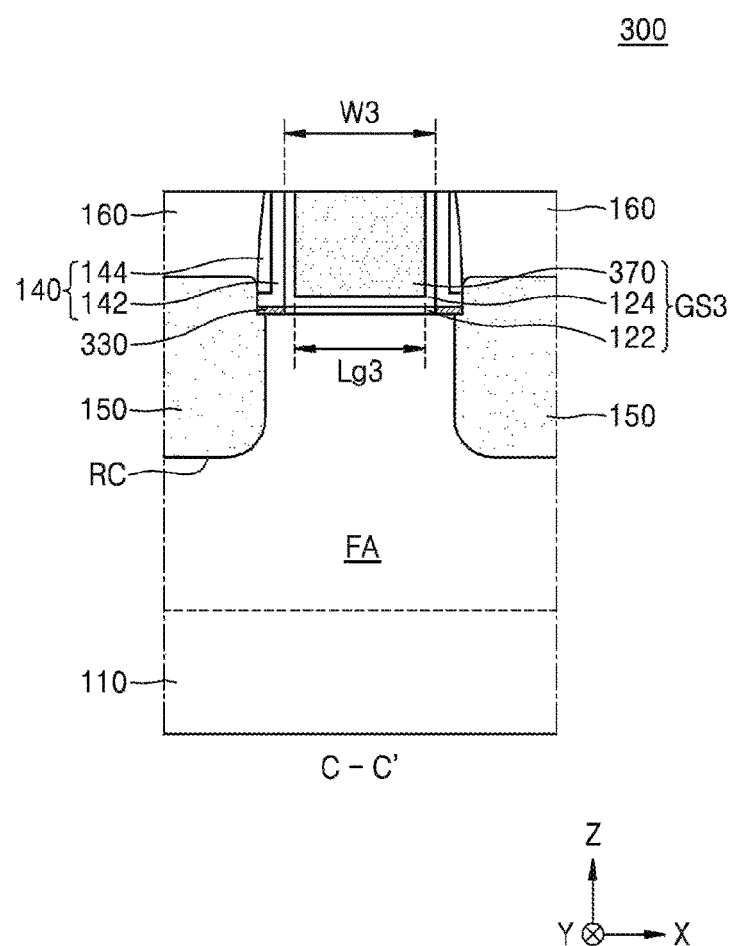
FIG. 4 is a cross-sectional view for explaining an integrated circuit device according to further exemplary implementations.

FIG. 4 is a cross-sectional view for explaining an integrated circuit device according to further exemplary implementations. FIG. 4 shows a cross-sectional view of the integrated circuit device, which corresponds to the cross-section taken along the line C-C' of FIG. 1B. In FIG. 4, the same reference numerals as in FIGS. 1A to 1D denote the same members, and descriptions thereof will be omitted.

As shown in FIG. 4, an integrated circuit device 300 has substantially the same configuration as the integrated circuit device 100 shown in FIGS. 1A to 1D. However, the integrated circuit device 300 includes a pair of width-setting patterns 330 on the fin-type active region FA on both sides of the gate electrode layer 170, the pair of width-setting patterns 330 being interposed between the insulating spacer 140 and the fin-type active region FA.

The pair of width-setting patterns 330 includes only a horizontally-extending portion on a bottom surface of the insulating spacer 140, and may not include a portion facing both sidewalls of the gate insulating layer 170.

Details of constituent materials of the pair of width-setting patterns 330 are as described as to the pair of width-setting patterns 130 with reference to FIGS. 1A to 1D.

In the integrated circuit device 300 shown in FIG. 4, the pair of the width-setting patterns 330 may maintain a width W3 of the space for forming the gate structure GS including the interfacial layer 122, the gate insulating layer 124, and the gate electrode layer 170 constant. The gate electrode layer 170 may have a gate length Lg3 that is less than the width W3 of the gate structure space, along the extension direction (X direction) of the fin-type active region FA. Since the width W3 of the space for forming the gate structure GS between the pair of the width-setting patterns 330 is maintained constant, the gate length Lg3 of the electrode layer 170 may be maintained constant.

Figure 5A:
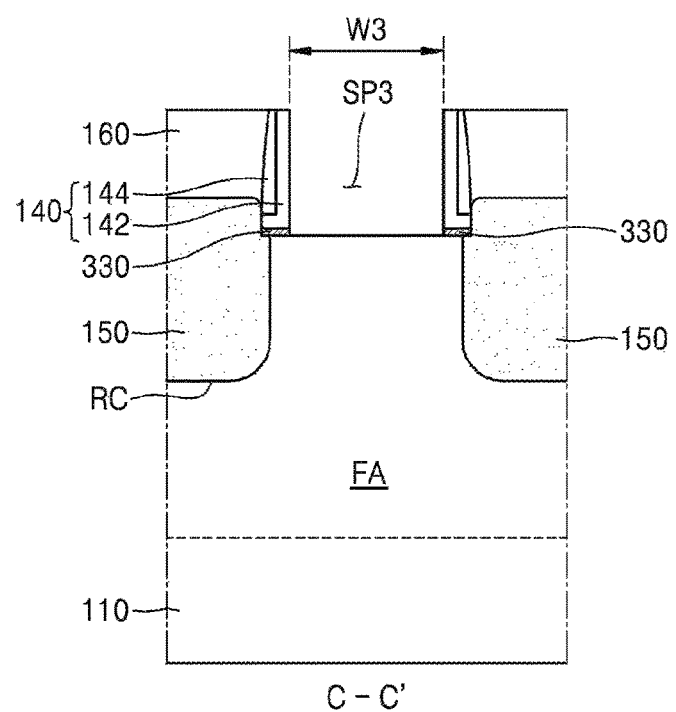
FIGS. 5A and 5B are cross-sectional views showing a method of fabricating an integrated circuit device according to a process order, according to exemplary implementations.
Figure 5B:
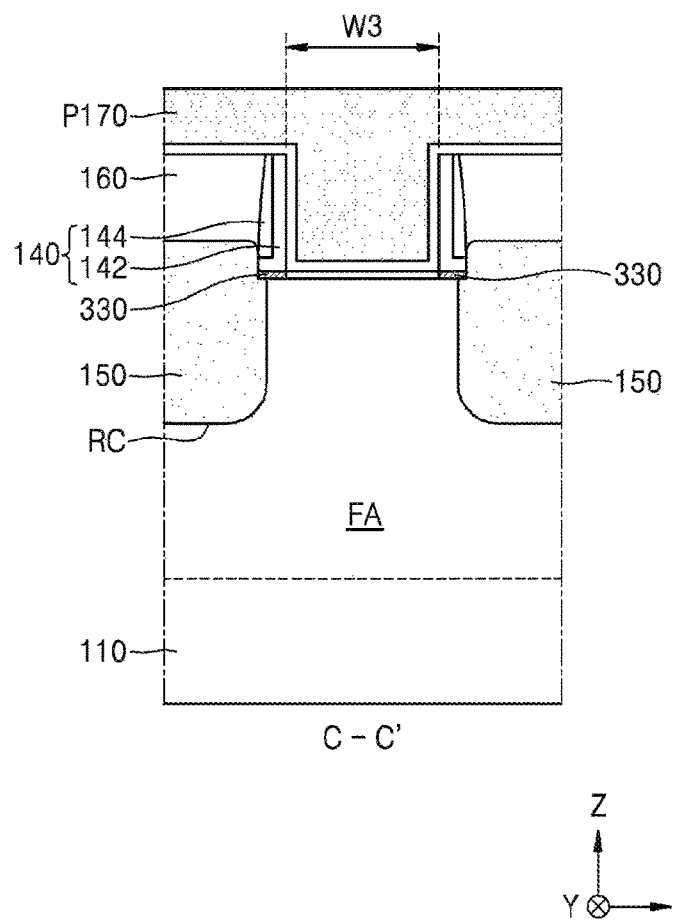

FIGS. 5A and 5B are cross-sectional views showing a method of fabricating an integrated circuit device according to a process order, according to exemplary implementations. An exemplary method of fabricating the integrated circuit device 300 shown in FIG. 4 will be described with reference to FIGS. 5A and 5B. In FIGS. 5A and 5B, configurations corresponding to the cross-section taken along the line C-C' of FIG. 1B are shown according to a process order. In FIGS. 5A and 5B, the same reference numerals as in FIGS. 1A to 2L denote the same members, and descriptions thereof will be omitted.

As shown in FIG. 5A, according to the same methods as described with reference to FIGS. 2A to 2J, the gate structure space SP1 (see FIG. 2J) is prepared by removing the dummy gate electrode layer D170 and the underlying dummy gate insulating layer D120 (see FIG. 2I), and then, the pair of width-setting patterns 130 (see FIG. 2I) are exposed at inner sidewalls of the gate structure space SP1.

Next, an enlarged gate structure space SP3 may be formed by removing the vertically-extending portion 130V of the pair of width-setting patterns 130 exposed by the gate structure space SP1, the vertically-extending portion 130V covering sidewalls of the insulating spacer 140. The first insulating spacer 142 of the insulating spacer 140 is exposed by the enlarged gate structure space SP3, and only the horizontally-extending portion 130H of the pair of width-setting patterns 130 shown in FIG. 2J remains between the bottom surface of the insulating spacer 140 and the top surface of the fin-type active region FA, thereby obtaining the pair of width-setting patterns 330 shown in FIG. 4.

As shown in FIG. 5B, in a similar method to the method described with reference to FIG. 2K, the interfacial layer 122 and the gate insulating layer 124 may be formed on the surface of the fin-type active region FA exposed by the enlarged gate structure space SP3 (see FIG. 5A), and the preliminary gate electrode layer P170 may be formed on the gate insulating layer 124 and fill the enlarged gate structure space SP3. Next, the integrated circuit device 300 shown in FIG. 4 may be fabricated by performing the process described with reference to FIG. 2L.

Figure 6:
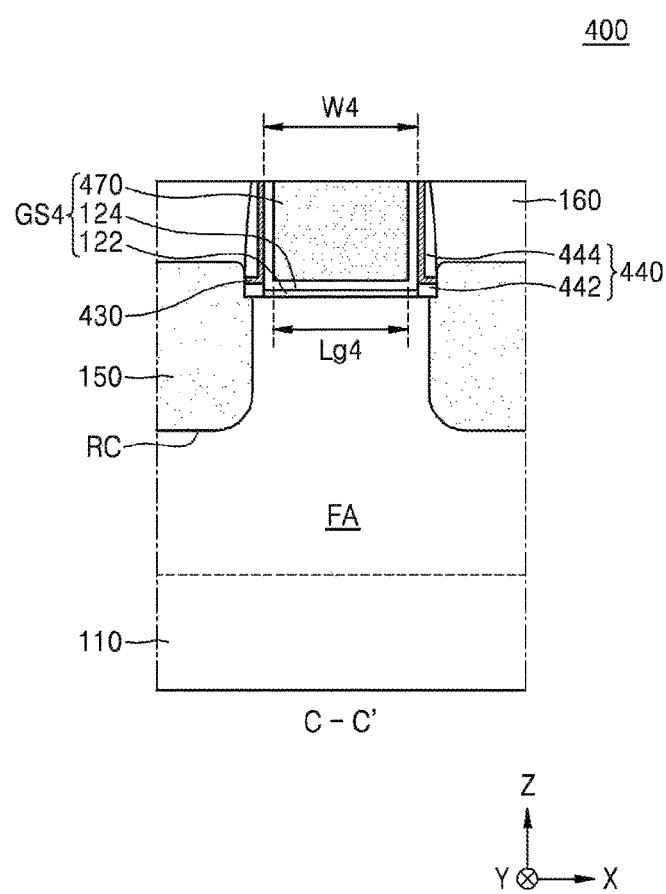
FIG. 6 is a cross-sectional view for explaining an integrated circuit device according to yet other exemplary implementations.

FIG. 6 is a cross-sectional view for explaining an integrated circuit device according to yet other exemplary implementations. FIG. 6 shows a cross-sectional view of the integrated circuit device, which corresponds to the cross-section taken along the line C-C' of FIG. 1B. In FIG. 6, the same reference numerals as in FIGS. 1A to 1D denote the same members, and descriptions thereof will be omitted.

As shown in FIG. 6, an integrated circuit device 400 has substantially the same configuration as the integrated circuit device 100 shown in FIGS. 1A to 1D. However, an insulating spacer 440 may include a first insulating spacer 442 between the fin-type active region FA and a pair of width-setting patterns 430, and a second insulating spacer 444 on the pair of width-setting patterns 430, the second insulating spacer 444 facing a sidewall of a gate electrode layer 470. The first insulating spacer 442 and the second insulating spacer 444 are spaced apart from each other, with the pair of width-setting patterns 430 being interposed between the first insulating spacer 442 and the second insulating spacer 444. The pair of width-setting patterns 430 are spaced apart from the fin-type active region FA, with the first insulating spacer 442 being interposed between the pair of width-setting patterns 430 and the fin-type active region FA.

In some exemplary implementations, the first insulating spacer 442 may include a silicon nitride layer. The second insulating spacer 444 may include a first carbon-containing insulating layer having a first carbon content. The pair of width-setting patterns 430 may include a second carbon-containing insulating layer having a second carbon content that is greater than the first carbon content. Details of the second insulating spacer 444 and the pair of width-setting patterns 430 are mostly the same as the details of the second insulating spacer 144 and the pair of width-setting patterns 130, which have been described with reference to FIGS. 1A to 1D.

The gate electrode layer 470 may have substantially the same configuration as the gate electrode layer 170 described with reference to FIGS. 1A to 1D. However, a gate length Lg4 of the gate electrode layer 470 may be greater than the gate length Lg1 of the gate electrode layer 170 shown in FIGS. 1A to 1D.

In the integrated circuit device 400 shown in FIG. 6, the pair of the width-setting patterns 430 may maintain a width W4 of a space for forming a gate structure GS4 including the interfacial layer 122, the gate insulating layer 124, and the gate electrode layer 470 constant. The gate electrode layer 470 may have a gate length Lg4 that is less than the width W4 of the gate structure space, along the extension direction (X direction) of the fin-type active region FA. Since the width W4 of the space for forming the gate structure GS4 between the pair of the width-setting patterns 430 is maintained constant, the gate length Lg4 of the electrode layer 470 may be maintained constant.

FIGS. 7A to 7E are cross-sectional views showing a method of fabricating an integrated circuit device according to a process order, according to exemplary implementations. An exemplary method of fabricating the integrated circuit device 400 shown in FIG. 6 will be described with reference to FIGS. 7A to 7E. In FIGS. 7A to 7E, configurations corresponding to the cross-section taken along the line C-C' of FIG. 1B are shown according to a process order. In FIGS. 7A to 7E, the same reference numerals as in FIGS. 1A to 2L denote the same members, and descriptions thereof will be omitted.

Figure 7A:
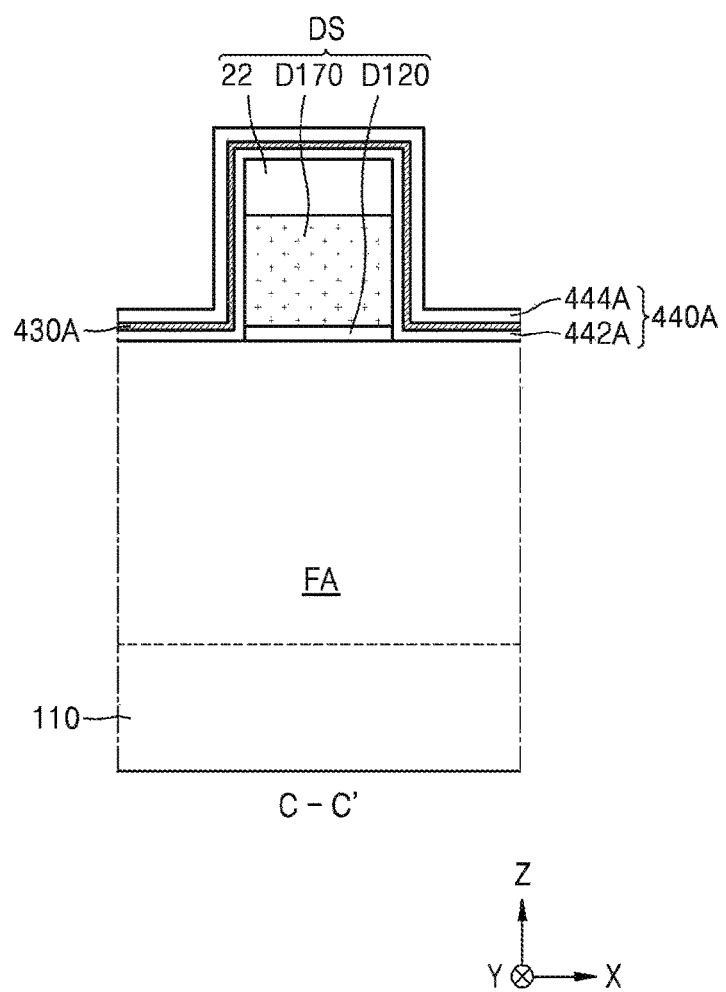
FIGS. 7A to 7E are cross-sectional views showing a method of fabricating an integrated circuit device according to a process order, according to exemplary implementations.

As shown in FIG. 7A, according to the same methods as described with reference to FIGS. 2A to 2F, the dummy gate insulating layer D120 and the dummy gate electrode layer D170 are formed on the fin-type active region FA and the device isolation layer 112 on the substrate 110, and then, a first insulating layer 442A for spacers, a width-setting layer 430A, and a second insulating layer 444A for spacers are formed to cover both sidewalls of each of the dummy gate insulating layer D120 and the dummy gate electrode layer D170, in this stated order.

Details of the first insulating layer 442A for spacers, the width-setting layer 430A, and the second insulating layer 444A for spacers are mostly the same as the details of the first insulating layer 142A for spacers, the width-setting layer 130A, and the second insulating layer 144A for spacers, which have been described with reference to FIG. 2F.

Figure 7B:
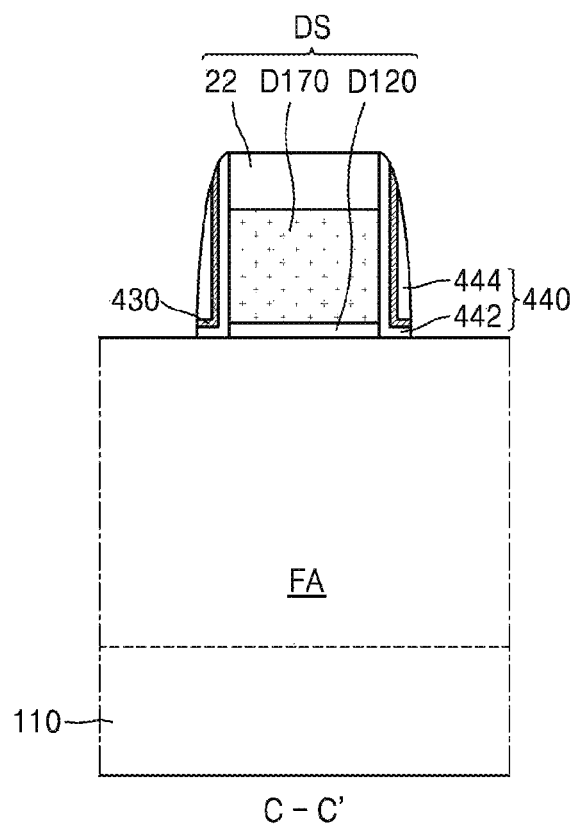

As shown in FIG. 7B, in a similar method to the method described with reference to FIG. 2G, the first insulating layer 442A for spacers, the width-setting layer 430A, and the second insulating layer 444A for spacers are subjected to etch-back, whereby the pair of width-setting patterns 430, and the insulating spacer 440 including the first insulating spacer 442 and the second insulating spacer 444 are formed on both sidewalls of the dummy structure DS, the first insulating spacer 442 and the second insulating spacer 444 being spaced apart from each other, with the pair of width-setting patterns 430 being interposed between the first insulating spacer 442 and the second insulating spacer 444.

Figure 7C:
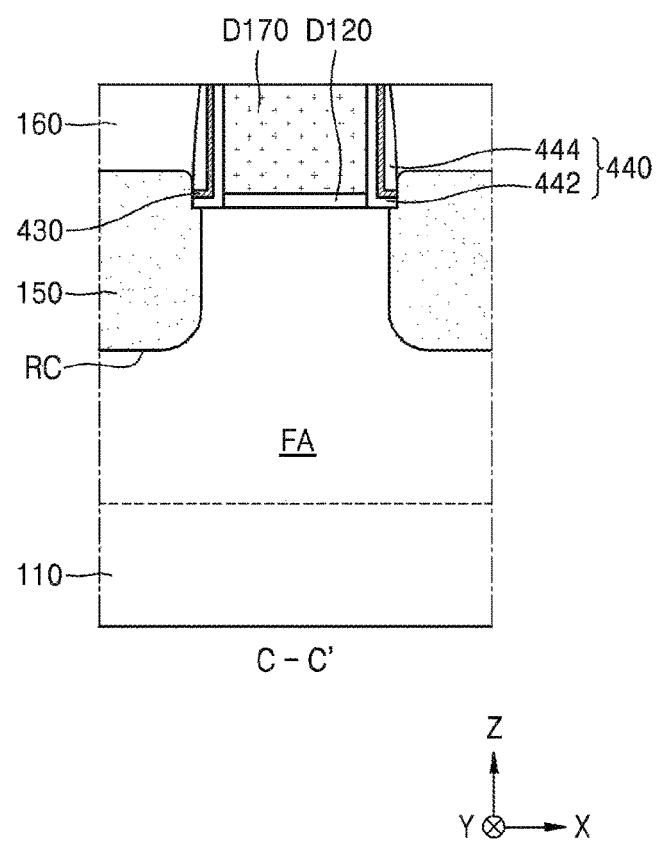

As shown in FIG. 7C, in a similar method to the method described with reference to FIG. 2H, the recess space RC is formed by partially removing the fin-type active region FA on both sides of the dummy structure DS (see FIG. 7B), and then, the pair of source/drain regions 150 are formed and fill the recess space RC.

Next, in a similar method to the method described with reference to FIG. 2I, the inter-gate dielectric 160 is formed on both sides of the dummy structure DS (see FIG. 7B) to cover the pair of source/drain regions 150 and the insulating spacer 440, and then, the result product including the inter-gate dielectric 160 is planarized by a CMP process or an etch-back process until the top surface of the dummy gate electrode layer D170 is exposed.

Figure 7D:
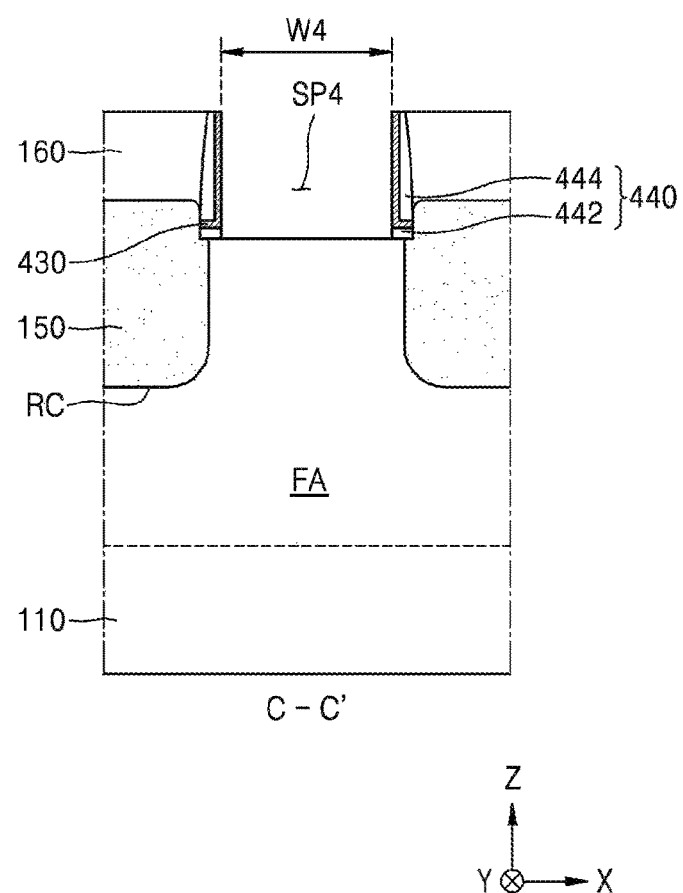

As shown in FIG. 7D, in a similar method to the method described with reference to FIG. 2J, a gate structure space SP4 is prepared by removing the dummy gate electrode layer D170 and the underlying dummy gate insulating layer D120. Here, after the dummy gate electrode layer D170 and the dummy gate insulating layer D120 are removed, the pair of width-setting patterns 430 are exposed at inner sidewalls of the gate structure space SP4 by removing a portion of the first insulating spacer 442, which is exposed by the gate structure space SP4.

As a result, a width W4 of the gate structure space SP4 may be defined in the extension direction (X direction) of the fin-type active region FA by the pair of width-setting patterns 430. The top surface of the fin-type active region FA may be exposed by the gate structure space SP4.

During a wet etching process for removing portions of the dummy gate electrode layer D170, the dummy gate insulating layer D120, and the first insulating spacer 442, which are exposed by the gate structure space SP4, the pair of width-setting patterns 430 defining the width W4 of the gate structure space SP4 may be exposed to an etching solution. The pair of width-setting patterns 430 may have the same configuration as the pair of width-setting patterns 130 described with reference to FIGS. 1A to 1D. As such, since the pair of width-setting patterns 430 include a material having relatively high carbon content, the pair of width-setting patterns 430 may have excellent resistance with respect to the etching solution. Therefore, even though exposed to the etching solution, the pair of width-setting patterns 430 may remain intact without being consumed by the etching solution. Therefore, the width W4 of the gate structure space SP4 may be maintained constant.

Figure 7E:
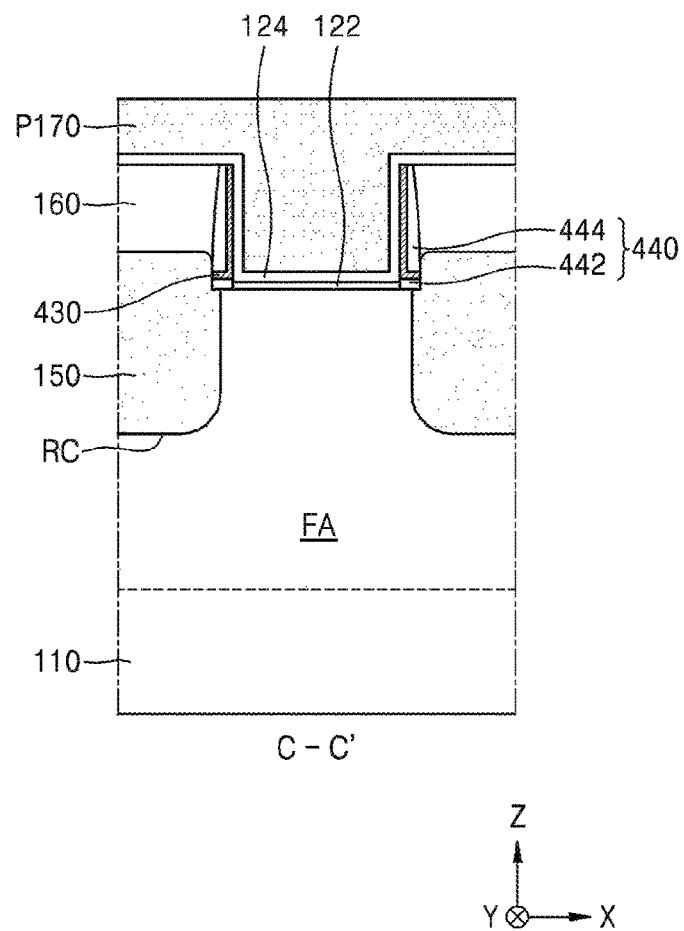

As shown in FIG. 7E, in a similar method to the method described with reference to FIG. 2K, the interfacial layer 122 and the gate insulating layer 124 are formed on the surface of the fin-type active region FA exposed by the gate structure space SP4 (see FIG. 7D), and the preliminary gate electrode layer P170 is formed on the gate insulating layer 124 and fills the gate structure space SP4.

Next, the integrated circuit device 400 shown in FIG. 6 may be fabricated by performing the process described with reference to FIG. 2L.

Figure 8:
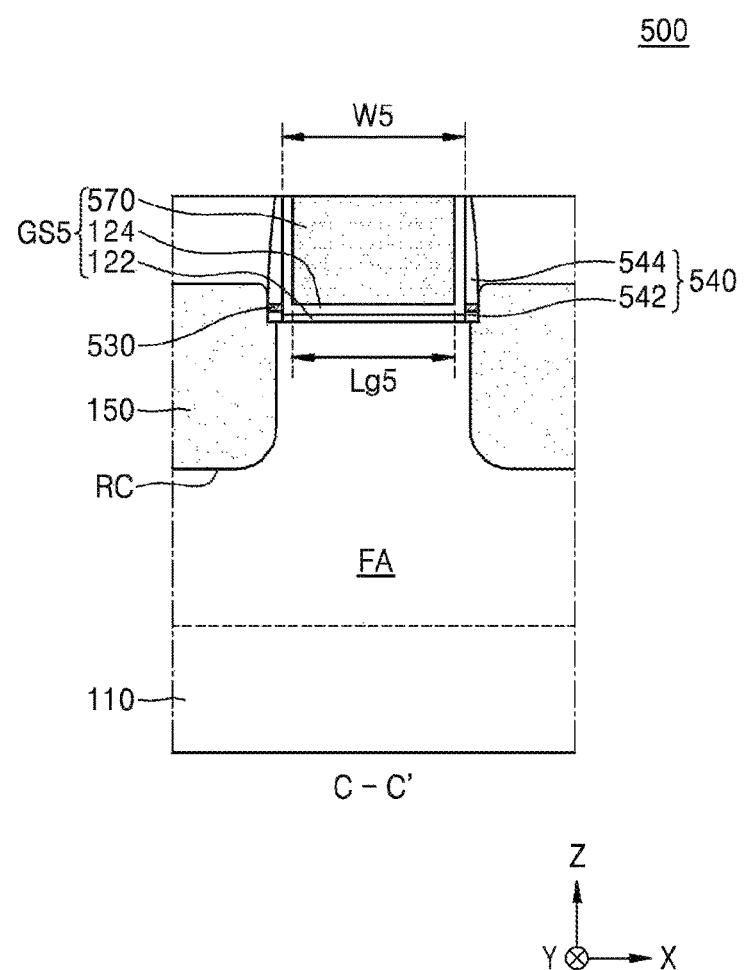
FIG. 8 is a cross-sectional view for explaining an integrated circuit device according to yet other exemplary implementations.

FIG. 8 is a cross-sectional view for explaining an integrated circuit device according to yet other exemplary implementations. FIG. 8 shows a cross-sectional view of the integrated circuit device, which corresponds to the cross-section taken along the line C-C' of FIG. 1B. In FIG. 8, the same reference numerals as in FIGS. 1A to 6 denote the same members, and descriptions thereof will be omitted.

As shown in FIG. 8, an integrated circuit device 500 has substantially the same configuration as the integrated circuit device 400 shown in FIG. 6. However, the integrated circuit device 500 includes a pair of width-setting patterns 530 over the fin-type active region FA on both sides of a gate electrode layer 570, the pair of width-setting patterns 530 being interposed between a first insulating spacer 542 and a second insulating spacer 544, which constitute an insulating spacer 540.

Details of the first insulating spacer 542 and the second insulating spacer 544, which constitute the insulating spacer 540, are mostly the same as the details of the first insulating spacer 442 and the second insulating spacer 444, which constitute the insulating spacer 440 shown in FIG. 6.

The pair of width-setting patterns 530 includes only a horizontally-extending portion between the first insulating spacer 542 and the second insulating spacer 544, and may not include a portion facing both sidewalls of the gate insulating layer 570.

Details of constituent materials of the pair of width-setting patterns 530 are as described as to the pair of width-setting patterns 130 with reference to FIGS. 1A to 1D.

In the integrated circuit device 500 shown in FIG. 8, the pair of the width-setting patterns 530 may maintain a width W5 of a space for forming a gate structure GS5 including the interfacial layer 122, the gate insulating layer 124, and the gate electrode layer 570 constant. The gate electrode layer 570 may have a gate length Lg5 that is less than the width W5 of the gate structure space, along the extension direction (X direction) of the fin-type active region FA. Since the width W5 of the space for forming the gate structure GS5 between the pair of the width-setting patterns 530 is maintained constant, the gate length Lg5 of the electrode layer 570 may be maintained constant.

Figure 9A:
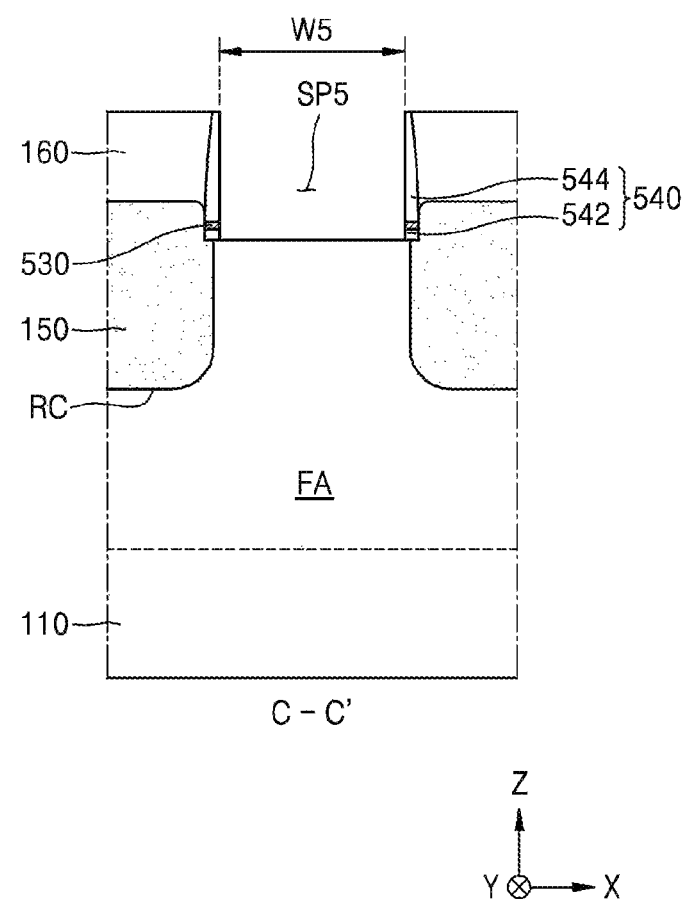
FIGS. 9A and 9B are cross-sectional views showing a method of fabricating an integrated circuit device according to a process order, according to exemplary implementations.
Figure 9B:
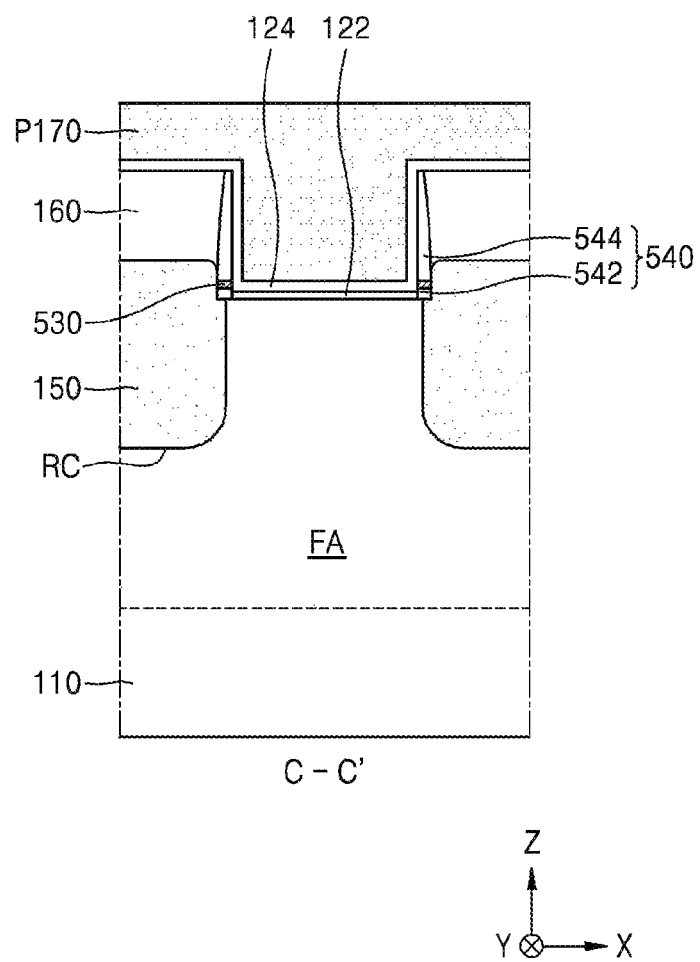

FIGS. 9A and 9B are cross-sectional views showing a method of fabricating an integrated circuit device according to a process order, according to exemplary implementations. An exemplary method of fabricating the integrated circuit device 500 shown in FIG. 8 will be described with reference to FIGS. 9A and 9B. In FIGS. 9A and 9B, configurations corresponding to the cross-section taken along the line C-C' of FIG. 1B are shown according to a process order. In FIGS. 9A and 9B, the same reference numerals as in FIGS. 1A to 8 denote the same members, and descriptions thereof will be omitted.

As shown in FIG. 9A, according to similar methods to the methods described with reference to FIGS. 7A to 7D, the gate structure space SP4 (see FIG. 7D) is prepared by removing the dummy gate electrode layer D170 and the underlying dummy gate insulating layer D120 (see FIG. 7C), and then, the pair of width-setting patterns 430 are exposed at the inner sidewalls of the gate structure space SP4 by removing the portion of the first insulating spacer 442, which is exposed by the gate structure space SP4.

Next, the pair of width-setting patterns 530 extending in a horizontal direction may remain by removing a vertically (Z-direction)-extending portion of the pair of width-setting patterns 430, the vertically-extending portion of the pair of width-setting patterns 430 covering a sidewall of the insulating spacer 440. Here, while the vertically-extending portion of the pair of width-setting patterns 430 is removed, the first insulating spacer 442 (see FIG. 7D) exposed by the gate structure space SP4 (see FIG. 7D) may also be partially removed and thus may remain as the first insulating spacer 542 having a reduced width, as shown in FIG. 9A. A portion of the second insulating spacer 444 on the pair of width-setting patterns 430 remains as the second insulating spacer 544 on the pair of width-setting patterns 530, and the first insulating spacer 542 and the second insulating spacer 544 constitute the insulating spacer 540. The insulating spacer 540 and the pair of width-setting patterns 530 define the width W5 of an enlarged gate structure space SP5.

As shown in FIG. 9B, in a similar method to the method described with reference to FIG. 2K, the interfacial layer 122 and the gate insulating layer 124 may be formed on the surface of the fin-type active region FA exposed by the gate structure space SP5 (see FIG. 9A), and the preliminary gate electrode layer P170 may be formed on the gate insulating layer 124 and fill the gate structure space SP5. Next, the integrated circuit device 500 shown in FIG. 8 may be fabricated by performing the process described with reference to FIG. 2L.

Figure 10A:
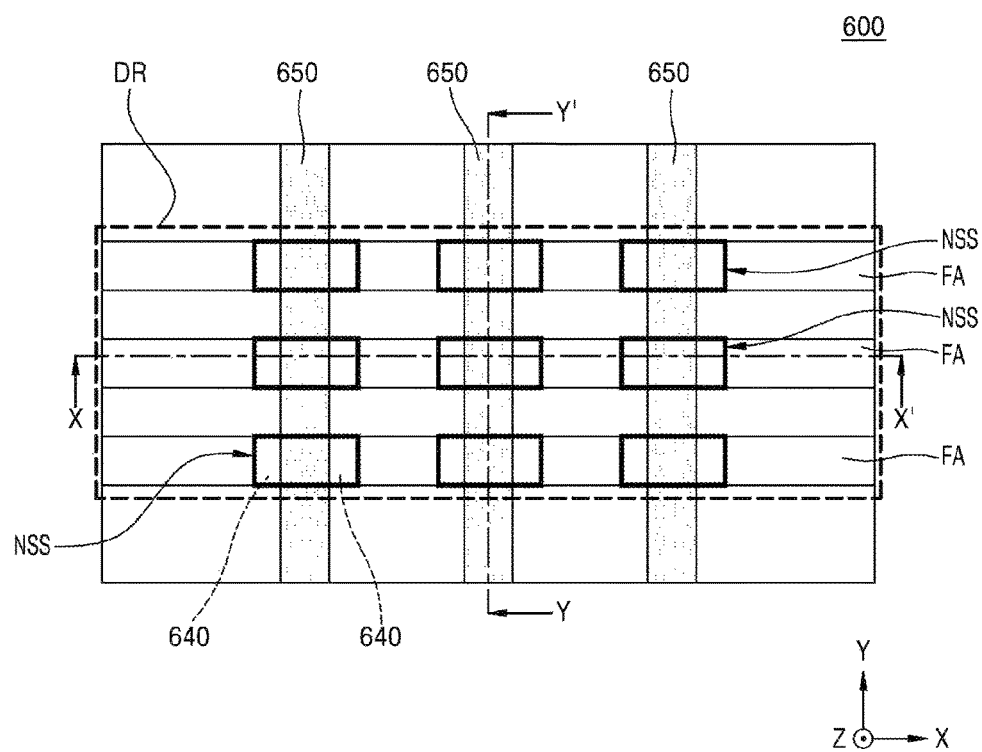
FIGS. 10A to 10C are diagrams for explaining an integrated circuit device according to yet other exemplary implementations.
Figure 10B:
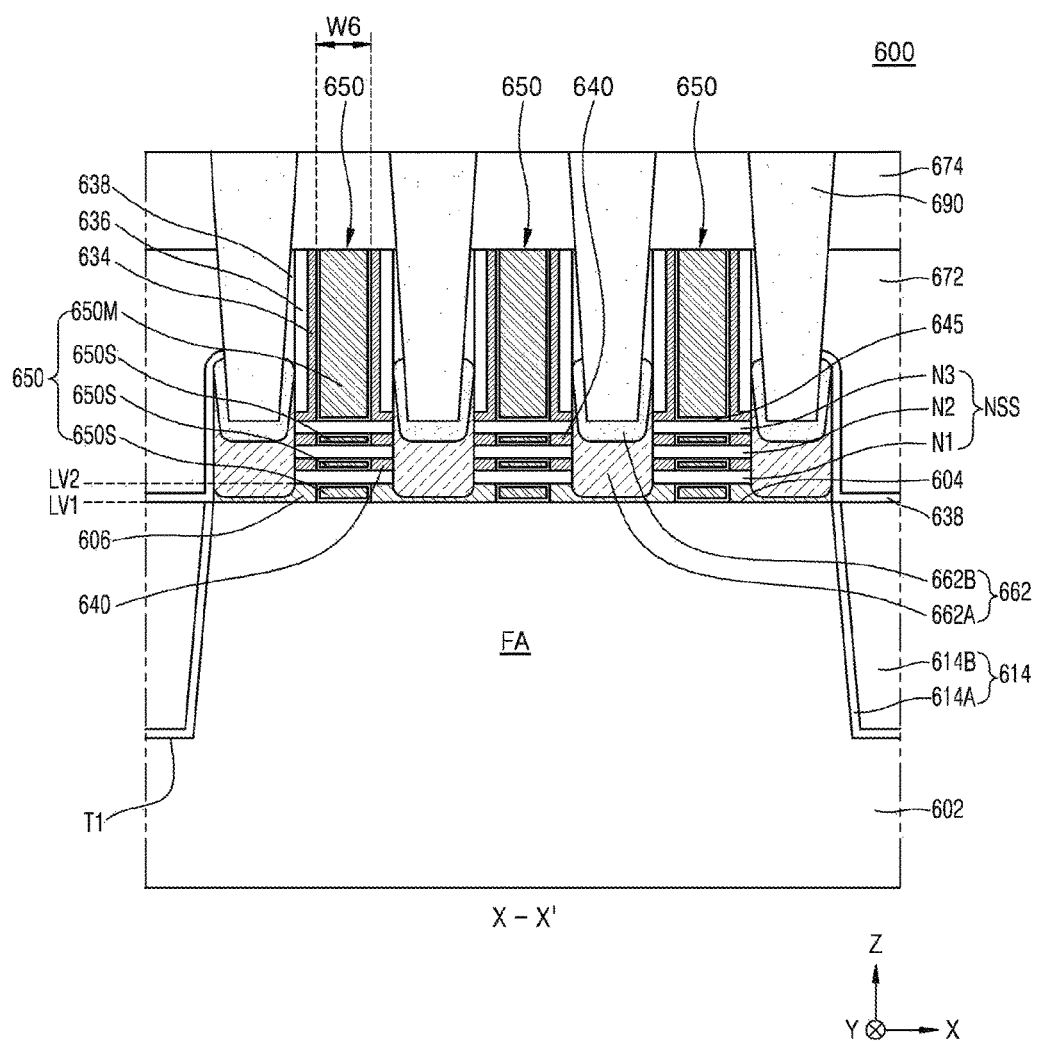
Figure 10C:
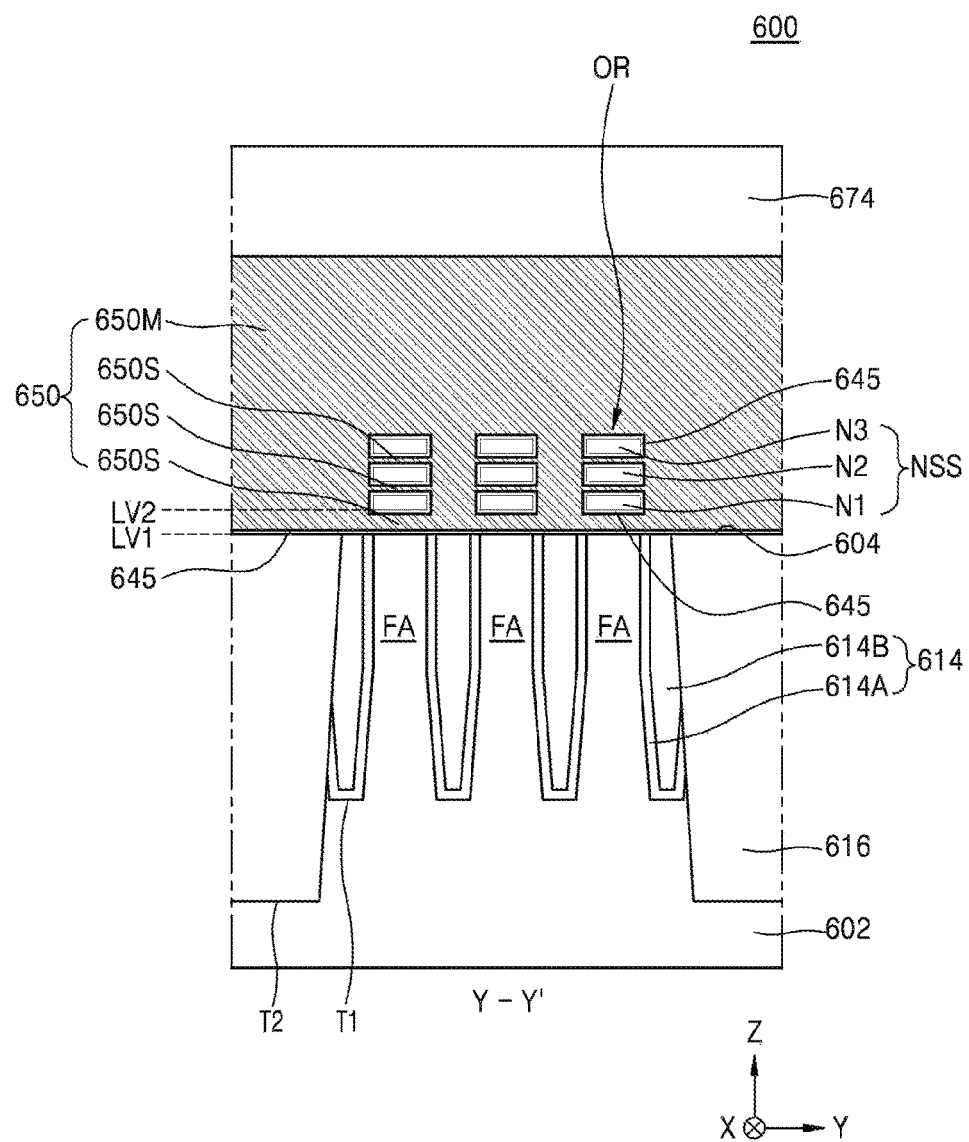

FIGS. 10A to 10C are diagrams for explaining an integrated circuit device according to yet other exemplary implementations, FIG. 10A is a planar layout diagram of an integrated circuit device 600, FIG. 10B is a cross-sectional view of the integrated circuit device 600 taken along a line X-X' of FIG. 10A, and FIG. 10C is a cross-sectional view of the integrated circuit device 600 taken along a line Y-Y' of FIG. 10A.

As shown in FIGS. 10A to 10C, the integrated circuit device 600 includes: a plurality of fin-type active regions FA protruding from a substrate 602 and extending in a first direction (X direction); and a plurality of nanosheet stacked structures NSS spaced apart from top surfaces 604 of the plurality of fin-type active regions FA and facing the top surfaces 604 of the plurality of fin-type active regions FA.

A first trench T1 defining the plurality of fin-type active regions FA and a second trench T2 defining a device region DR may be formed in the substrate 602. The second trench T2 may be more deeply formed than the first trench T1.

Lower sidewalls of the plurality of fin-type active regions FA may be covered with a shallow trench isolation (STI) layer 614 filling the first trench T1. The STI layer 614 may include an insulating liner 614A conformally covering an inner wall of the first trench T1, and a gap-fill insulating layer 614B on the insulating liner 614A, the gap-fill insulating layer 614B filling the first trench T1. The second trench T2 may be filled with a device isolation layer 616. The top surfaces 604 of the plurality of fin-type active regions FA, a top surface of the STI layer 614, and a top surface of the device isolation layer 616 may be at equal or similar levels.

A plurality of gates 650 extend over the plurality of fin-type active regions FA in a second direction (Y direction) intersecting with the first direction. The plurality of fin-type active regions FA have top surfaces 604 that are at a first level LV1.

The plurality of nanosheet stacked structures NSS are spaced apart from the top surfaces 604 of the plurality of fin-type active regions FA. Each of the plurality of nanosheet stacked structures NSS may be at a second level LV2 that is farther away from the substrate 602 than the first level LV1 and may include a plurality of nanosheets N1, N2, and N3 extending parallel to a top surfaces 604 of each of the plurality of fin-type active regions FA. In the present exemplary implementation, a plurality of nanosheet stacked structures NSS and a plurality of gates 650 are formed over one fin-type active region FA, and the plurality of nanosheet stacked structures NSS are arranged over the one fin-type active region FA in a line along an extension direction (X direction) of the one fin-type active region FA. However, the inventive concept is not limited thereto. The number of nanosheet stacked structures NSS arranged over one fin-type active region FA is not particularly limited. For example, one nanosheet stacked structure NSS may be formed over one fin-type active region FA.

The plurality of nanosheets N1, N2, and N3 constituting each of the plurality of nanosheet stacked structures NSS are sequentially stacked over the top surfaces 604 of the plurality of fin-type active regions FA in this stated order. In the present exemplary implementation, although an example, in which one nanosheet stacked structure NSS includes three nanosheets N1, N2, and N3, is shown, the inventive concept is not limited thereto. For example, each of the plurality of nanosheet stacked structures NSS may include one nanosheet, or may include a variously selected plurality of nanosheets, as needed. Each of the plurality of nanosheets N1, N2, and N3 may have a channel area.

The plurality of gates 650 may surround at least a portion of the plurality of nanosheets N1, N2, and N3 while covering the nanosheet stacked structures NSS. Each of the plurality of gates 650 may include: a main gate portion 650M covering a top surface of each nanosheet stacked structure NSS; and a plurality of sub-gate portions 650S in spaces between each fin-type active region FA and the nanosheets N1, N2, and N3, the plurality of sub-gate portions 650S being connected to the main gate portion 650M. A thickness of each of the plurality of sub-gate portions 650S may be less than a thickness of the main gate portion 650M. Here, the thicknesses of the plurality of sub-gate portions 650S and the thickness of the main gate portion 650M refer to sizes along a Z direction in FIGS. 10A to 10C.

A gate insulating layer 645 is formed between the nanosheet stacked structures NSS and the gates 650.

The plurality of nanosheets N1, N2, and N3 are formed in overlap regions OR, in which the fin-type active regions FA is covered with the gates 650. In an X-Y plane, the nanosheet stacked structures NSS including the plurality of nanosheets N1, N2, and N3 may have flat areas that are greater than flat areas of the overlap regions OR. In FIG. 10A, although the nanosheet stacked structures NSS are shown as having planar shapes of approximate quadrangles, the inventive concept is not limited thereto. The nanosheet stacked structures NSS may have various planar shapes depending upon planar shapes of the fin-type active regions FA and planar shapes of the gates 650.

Details of the substrate 602 are mostly similar to the details of the substrate 110, which have been described with reference to FIGS. 1A to 1D.

In some exemplary implementations, the plurality of nanosheets N1, N2, and N3 may include a single material. In some exemplary implementations, the plurality of nanosheets N1, N2, and N3 may include the same material as a constituent material of the substrate 602.

The insulating liner 614A covering the inner wall of the first trench T1 may include an oxide layer, silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or combinations thereof. In some exemplary implementations, the insulating liner 614A may have a thickness of about 10 Å to about 100 Å.

In some exemplary implementations, the gap-fill insulating layer 614B may include an oxide layer. In some exemplary implementations, the gap-fill insulating layer 614B may include an oxide layer formed by a deposition process or a coating process. In some exemplary implementations, the gap-fill insulating layer 614B may include an oxide layer formed by an FCVD process or a spin coating process. For example, the gap-fill insulating layer 614B may include FSG, USG, BPSG, PSG, FOX, PE-TEOS, or TOSZ, without being limited thereto.

The device isolation layer 616 filling the second trench T2 may include an oxide layer, a nitride layer, or combinations thereof. In some exemplary implementations, the device isolation layer 616 and the gap-fill insulating layer 614B may include the same material.

The gate insulating layer 645 may include a stacked structure of an interfacial layer and a high-K dielectric layer. The interfacial layer may cure interfacial defects between the high-K dielectric layer and the fin-type active regions FA and between the high-K dielectric layer and the plurality of nanosheets N1, N2, and N3 while being on the top surfaces of the fin-type active regions FA and on surfaces of the plurality of nanosheets N1, N2, and N3. In some exemplary implementations, details of the interfacial layer are mostly similar to the details of the interfacial layer 122 described with reference to FIGS. 1A to 1D. The high-K dielectric layer may include a material having a greater dielectric constant than a silicon oxide layer. Exemplary materials capable of being used for the high-K dielectric layer may refer to the descriptions of the gate insulating layer 124, which have been made with reference to FIGS. 1A to 1D.

Details of constituent materials of the gates 650 are mostly the same as the details of the gate electrode layer 170, which have been described with reference to FIGS. 1A to 1D.

A plurality of source/drain regions 662 are formed over the fin-type active regions FA. Each of the plurality of source/drain regions 662 is connected to ends of the plurality of nanosheets N1, N2, and N3, which are adjacent to each of the plurality of source/drain regions 662.

Each of the plurality of source/drain regions 662 may include a semiconductor layer 662A epitaxially grown to contact nanosheets N1, N2, and N3. For example, semiconductor layer 662A may be grown on buffer semiconductor layer 606 and to contact nanosheets N1, N2, and N3, as shown in FIG. 10B. The plurality of source/drain regions 662 may include an epitaxially grown Si layer, an epitaxially grown SiC layer, an embedded SiGe structure including a plurality of epitaxially grown SiGe layers, or the like. Each of the plurality of source/drain regions 662 may further include a metal silicide layer 662B on the semiconductor layer 662A. In some exemplary implementations, the metal silicide layer 662B may include titanium silicide, without being limited thereto. In some exemplary implementations, the metal silicide layer 662B may be omitted.

A width-setting pattern 634, and a first insulating spacer 636 are formed on the plurality of nanosheet stacked structures. A protective layer 638 is formed adjacent to first insulating spacer 636 and width-setting pattern 634 so that width-setting pattern 634, first insulating spacer 636, and protective layer 638 cover a sidewall of each gate 650 in this stated order.

Figure 11:
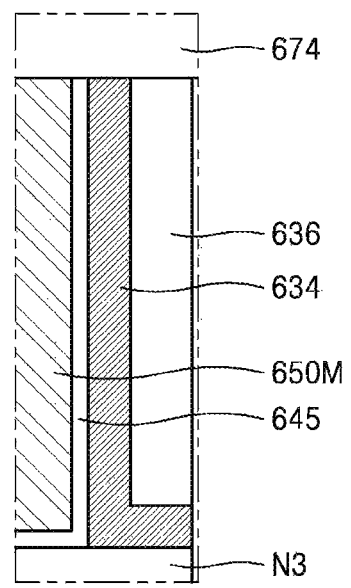
FIG. 11 is an enlarged cross-sectional view of a partial region of the integrated circuit device shown in FIGS. 10A to 10C, the partial region of the integrated circuit device including a width-setting pattern.

FIG. 11 is an enlarged cross-sectional view of a partial region of the integrated circuit device 600 shown in FIGS. 10A to 10C, the partial region of the integrated circuit device 600 including the width-setting pattern 634.

As shown in FIGS. 10A to 10C and FIG. 11, the width-setting pattern 634 may maintain a width W6 of a space for forming a gate structure including the gate insulating layer 645 and each gate 650 constant. Each gate 650 may have a gate length that is less than the width W6 of the space for forming the gate structure, along an extension direction (X direction) of the fin-type active regions FA. Since the width W6 of the space for forming the gate structure between a pair of width-setting patterns 634 covering both sidewalls of each gate 650 is maintained constant, the gate length of each gate 650 may be maintained constant.

The first insulating spacer 636 may include a first carbon-containing insulating layer having a first carbon content. In some exemplary implementations the first carbon-containing insulating layer constituting the first insulating spacer 636 may include a SiOCN layer, a SiCN layer, or combinations thereof. Details of a constituent material of the first insulating spacer 636 are as described as to the second insulating spacer 144 with reference to FIGS. 1A to 1D.

The width-setting pattern 634 may include a second carbon-containing insulating layer having a second carbon content that is greater than the first carbon content. In some exemplary implementations, the first carbon-containing insulating layer constituting the first insulating spacer 636 may have a first carbon content selected from a range of about 5 atom % to about 15 atom %, and the second carbon-containing insulating layer constituting the width-setting pattern 634 may have a second carbon content, which is selected from a range of about 10 atom % to about 25 atom % and is greater than the first carbon content. In some exemplary implementations, the width-setting pattern 634 may include a SiOCN layer, a SiCN layer, or combinations thereof. In one exemplary implementation, the first carbon-containing insulating layer constituting the first insulating spacer 636 may include a SiOCN layer having a first carbon content selected from a range of about 5 atom % to about 15 atom %, and the second carbon-containing insulating layer constituting the width-setting pattern 634 may include a SiOCN or SiCN layer having a second carbon content that is greater than the first carbon content. Details of the width-setting pattern 634 are as described as to the width-setting pattern 130 described with reference to FIGS. 1A to 1D.

The protective layer 638 may extend to cover the plurality of source/drain regions 662. The protective layer 638 may include a silicon nitride layer.

The width-setting pattern 634, the first insulating spacer 636, and the protective layer 638 may cover a sidewall of the main gate portion 650M of each gate 650.

The second insulating spacer 640 is formed in spaces between the plurality of nanosheets N1, N2, and N3 and contacts the source/drain regions 662.

The second insulating spacer 640 may be located between the sub-gate portions 650S and the source/drain regions 662 while being interposed between the plurality of nanosheets N1, N2, and N3. The second insulating spacer 640 may cover a sidewall of at least a portion of the plurality of sub-gate portions 650S. In the integrated circuit device 600 shown in FIG. 10B, the second insulating spacer 640 covers both sidewalls of each of two remaining sub-gate portions 650S except a sub-gate portion 650S closest to the fin-type active regions FA among three sub-gate portions 650S. As shown in FIG. 10B, both sidewalls of the sub-gate portion 650S closest to each source/drain regions FA among the three sub-gate portions 650S may be covered with a buffer semiconductor layer 606 covering the top surfaces 604 of the fin-type active regions FA.

The buffer semiconductor layer 606 may include a material that is different from materials constituting the fin-type active regions FA and the plurality of nanosheets N1, N2, and N3. For example, the buffer semiconductor layer 606 may include Ge.

Figure 12:
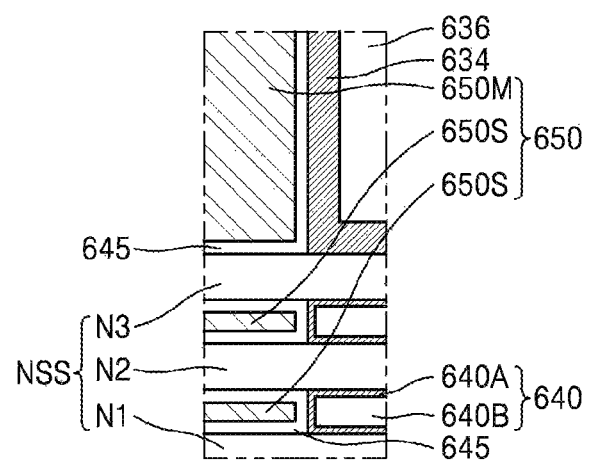
FIG. 12 is an enlarged cross-sectional view of a partial region of the integrated circuit device shown in FIGS. 10A to 10C, the partial region of the integrated circuit device including a second insulating spacer.

FIG. 12 is an enlarged cross-sectional view of a partial region of the integrated circuit device 600 shown in FIGS. 10A to 10C, the partial region of the integrated circuit device 600 including the second insulating spacer 640.

Referring to FIGS. 10A to 10C and FIG. 12, the second insulating spacer 640 may have a multilayer structure, in which an inner width-setting pattern 640A and an inner insulating pattern 640B are stacked in this stated order.

The inner width-setting pattern 640A may have the same configuration as the width-setting pattern 130 described with reference to FIGS. 1A to 1D.

The inner insulating pattern 640B may include at least one selected from among an air space, SiN, SiCN, SiBN, SiON, SiOCN, SiBCN, SiOC, and $SiO_2$.

As shown in FIGS. 10A to 10C, an inter-gate dielectric 672 and an interlayer dielectric 674 are formed over the plurality of source/drain regions 662 in this stated order. Each of the inter-gate dielectric 672 and the interlayer dielectric 674 may include a silicon oxide layer, without being limited thereto.

A contact plug 690 may be connected to each of the plurality of source/drain regions 662. The contact plug 690 may penetrate the interlayer dielectric 674, the inter-gate dielectric 672, and the protective layer 638 to be connected to each of the plurality of source/drain regions 662. The metal silicide layer 662B may be located between the semiconductor layer 662A and the contact plug 690. The contact plug 690 may include a metal, a conductive metal nitride, or combinations thereof. For example, the contact plug 690 may include W, Cu, Al, Ti, Ta, TiN, TaN, alloys thereof, or combinations thereof, but the inventive concept is not limited thereto.

The integrated circuit device 600 described with reference to FIGS. 10A to 10C, 11, and 12 includes a plurality of second insulating spacers 640 in the spaces between the plurality of nanosheets N1, N2, and N3 over the fin-type active regions FA, the plurality of second insulating spacers 640 contacting the source/drain regions 662. Since each of the plurality of second insulating spacers 640 includes the inner width-setting pattern 640A, lengths of the sub-gate portions 650S along the X direction may be constantly controlled, the sub-gate portions 650S being located in the spaces between the plurality of nanosheets N1, N2, and N3.

FIGS. 13A to 13J are cross-sectional views showing a method of fabricating an integrated circuit device according to a process order, according to exemplary implementations. An exemplary method of fabricating the integrated circuit device 600 shown in FIGS. 10A to 10C will be described with reference to FIGS. 13A to 13J. FIGS. 13A to 13J respectively show cross-sectional views of the integrated circuit device 600, which correspond to the cross-section taken along the line X-X' of FIG. 10A. In FIGS. 13A to 13J, the same reference numerals as in FIGS. 10A to 12 denote the same members, and descriptions thereof will be omitted.

Figure 13A:
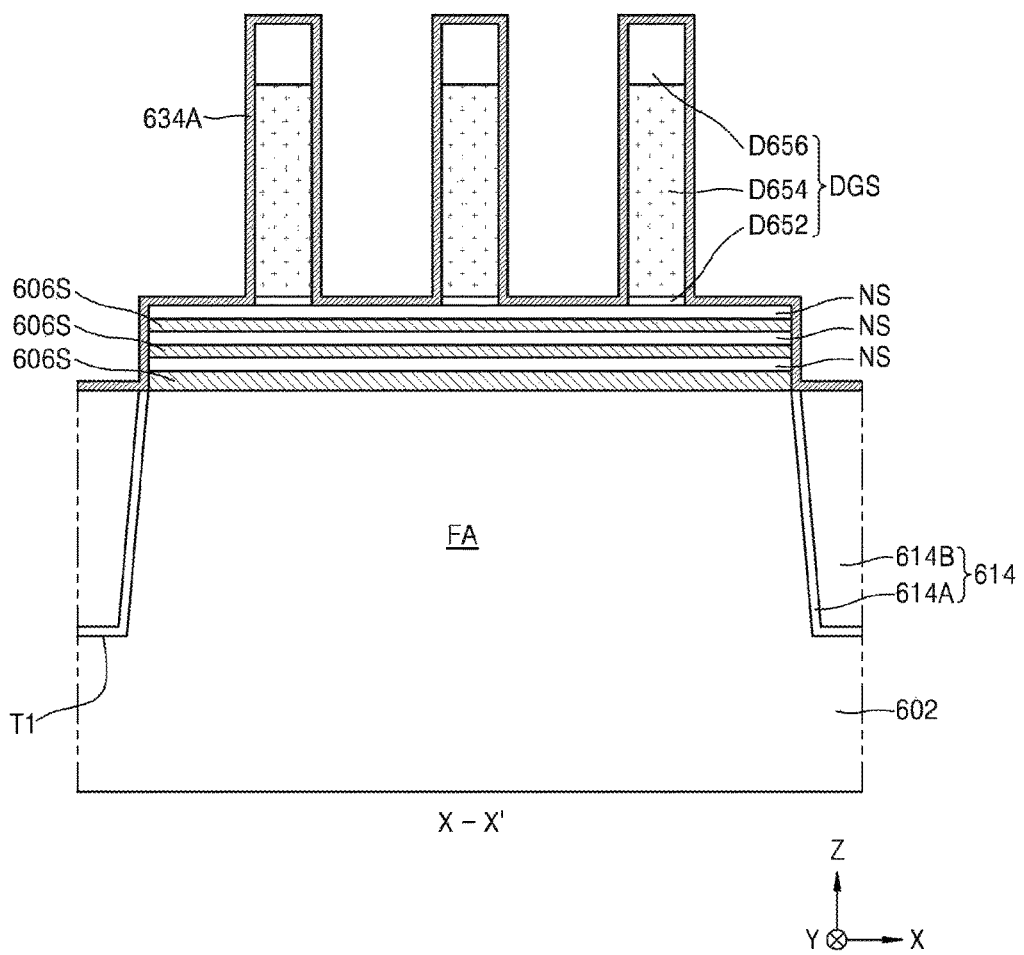
FIGS. 13A to 13J are cross-sectional views showing a method of fabricating an integrated circuit device according to a process order, according to exemplary implementations.

As shown in FIG. 13A, a plurality of sacrificial semiconductor layers 606S and a plurality of nanosheet semiconductor layers NS are alternately stacked on a substrate 602, layer by layer.

The plurality of sacrificial semiconductor layers 606S may include a material different from a material included in the plurality of nanosheet semiconductor layers NS. In some exemplary implementations, the plurality of sacrificial semiconductor layers 606S may include SiGe, and the plurality of nanosheet semiconductor layers NS may include Si, without being limited thereto.

A thickness of a sacrificial semiconductor layer 606S closest to the substrate 602 among the plurality of sacrificial semiconductor layers 606S may be greater than thicknesses of the other sacrificial semiconductor layer 606S. However, the inventive concept is not limited thereto. For example, all of the plurality of sacrificial semiconductor layers 606S may have the same thickness.

Next, a plurality of first trenches T1 are formed by etching a stacked structure of the plurality of sacrificial semiconductor layers 606S and the plurality of nanosheet semiconductor layers NS and etching a portion of the substrate 602, and a plurality of fin-type active regions FA defined by the plurality of first trenches T1 are formed. After the plurality of fin-type active regions FA are formed, the stacked structure of the plurality of sacrificial semiconductor layers 606S and the plurality of nanosheet semiconductor layers NS remains on the plurality of fin-type active regions FA.

An STI layer 614 including an insulating liner 614A and a gap-fill insulating layer 614B is formed in the plurality of first trenches T1, and then, some structures are etched from a result product including the plurality of fin-type active regions FA and the STI layer 614, thereby forming a second trench T2 defining a device region DR, as shown in FIGS. 10A and 10C. Next, a device isolation layer 616 is formed in the second trench T2.

A plurality of dummy gate structures DGS are formed on the plurality of fin-type active regions FA and extend to intersect with the plurality of fin-type active regions FA. The dummy gate structures DGS may have a structure, in which an oxide layer D652, a dummy gate layer D654, and a capping layer D656 are stacked in this stated order. The dummy gate structures DGS may have planar shapes corresponding to the planar shapes of the gates 650 shown in FIG. 10A. In some exemplary implementations, the dummy gate layer D654 may include polysilicon, and the capping layer D656 may include a silicon nitride layer, without being limited thereto.

A width-setting layer 634A is formed to cover exposed surfaces of the dummy gate structures DGS, an exposed surface of the stacked structure of the plurality of sacrificial semiconductor layers 606S and the plurality of nanosheet semiconductor layers NS, and a top surface of each of the STI layer 614 and the device isolation layer 616.

The width-setting layer 634A may have the same configuration as the width-setting layer 130A described with reference to FIG. 2F.

Figure 13B:
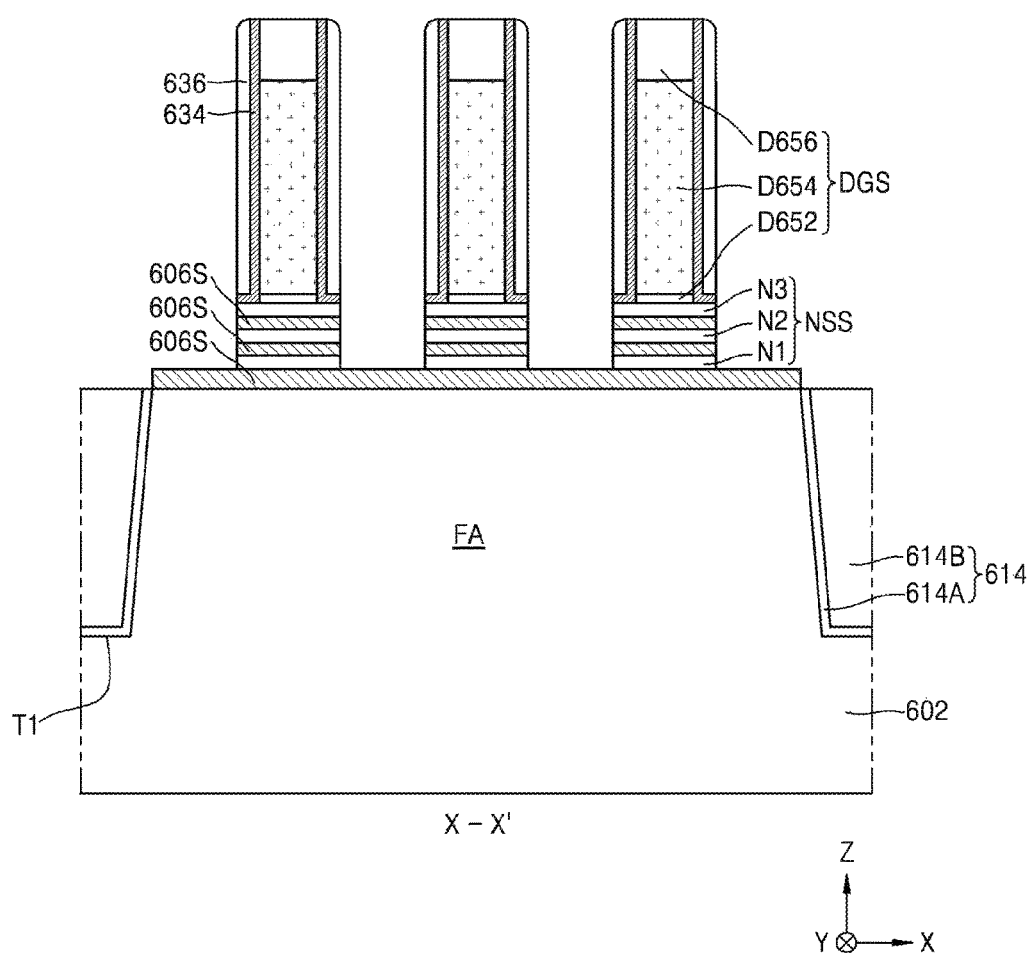

As shown in FIG. 13B, a first insulating spacer 636 is formed on the width-setting layer 634A and covers both sidewalls of each of the dummy gate structures DGS, and a plurality of width-setting patterns 634 are formed by patterning the width-setting layer 634A. Next, the stacked structure of the plurality of sacrificial semiconductor layers 606S and the plurality of nanosheet semiconductor layers NS is partially removed by etching using the dummy gate structures DGS, the width-setting patterns 634, and the first insulating spacer 636 as an etch mask, thereby forming a plurality of nanosheet stacked structures NSS from the plurality of nanosheet semiconductor layers NS, the plurality of nanosheet stacked structures NSS including a plurality of nanosheets N1, N2, and N3.

In a process of forming the first insulating spacer 636, a spacer layer including the same material as the first carbon-containing insulating layer described with reference to FIGS. 10A to 10C is formed on a result product of FIG. 13A, in which the width-setting layer 634A is formed, followed by performing etch-back of the spacer layer and the width-setting layer 634A, whereby the width-setting patterns 634 and the first insulating spacer 636 may remain.

In etching the stacked structure of the plurality of sacrificial semiconductor layers 606S and the plurality of nanosheet semiconductor layers NS, an etch process may be performed by taking, as an end time point of the etching, a time point at which a lowermost sacrificial semiconductor layer 606S of the plurality of sacrificial semiconductor layers 606S is exposed. Thus, after the plurality of nanosheet stacked structures NSS are formed, the sacrificial semiconductor layers 606S may be exposed between the plurality of nanosheet stacked structures NSS while covering the fin-type active regions FA. After the plurality of nanosheet stacked structures NSS are formed, the sacrificial semiconductor layers 606S remain between the fin-type active regions FA and the plurality of nanosheet stacked structures NSS and between the plurality of nanosheets N1, N2, and N3.

Figure 13C:
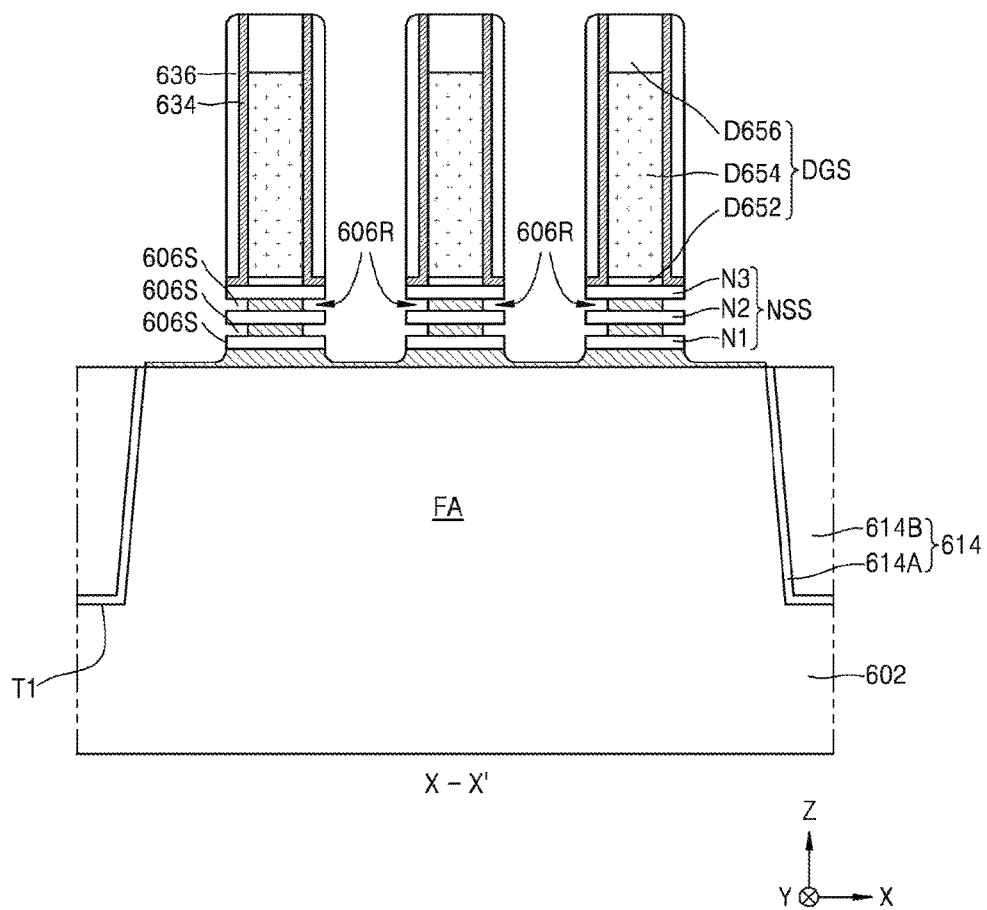

As shown in FIG. 13C, the plurality of sacrificial semiconductor layers 606S exposed on both sides of each of the plurality of nanosheet stacked structures NSS are partially removed by an anisotropic etching process, thereby forming recess regions 606R between the plurality of nanosheets N1, N2, and N3.

During the formation of the recess regions 606R, an exposed portion of the lowermost sacrificial semiconductor layer 606S between the plurality of nanosheet stacked structures NSS may also be partially removed from a top surface of the exposed portion of the lowermost sacrificial semiconductor layer 606S, the lowermost sacrificial semiconductor layer 606S covering the fin-type active regions FA.

In some exemplary implementations, the anisotropic etching process for forming the recess regions 606R may be performed by a wet etching process using a difference in etch selectivity between the plurality of sacrificial semiconductor layers 606S and the plurality of nanosheets N1, N2, and N3.

Figure 13D:
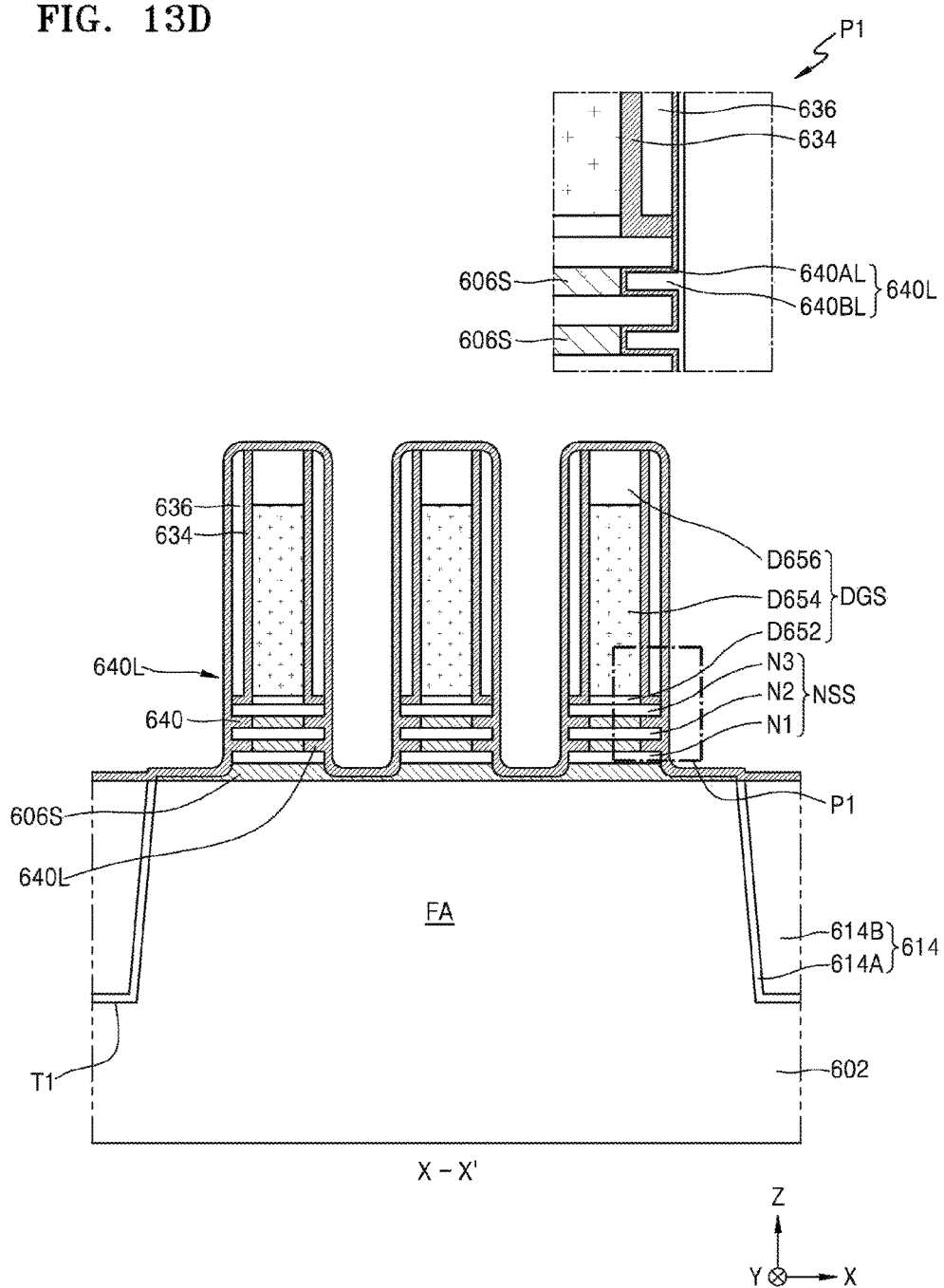

As shown in FIG. 13D, an insulating structure 640L is formed to fill the recess regions 606R (see FIG. 13C) between the plurality of nanosheets N1, N2, and N3. The insulating structure 640L may include a width-setting layer 640AL and an inner insulating layer 640BL, which are stacked in the recess regions 606R in this stated order.

The width-setting layer 640AL may have the same configuration as the width-setting layer 130A described with reference to FIG. 2F.

The inner insulating layer 640BL may include at least one selected from among SiN, SiCN, SiBN, SiON, SiOCN, SiBCN, SiOC, and $SiO_2$.

Figure 13E:
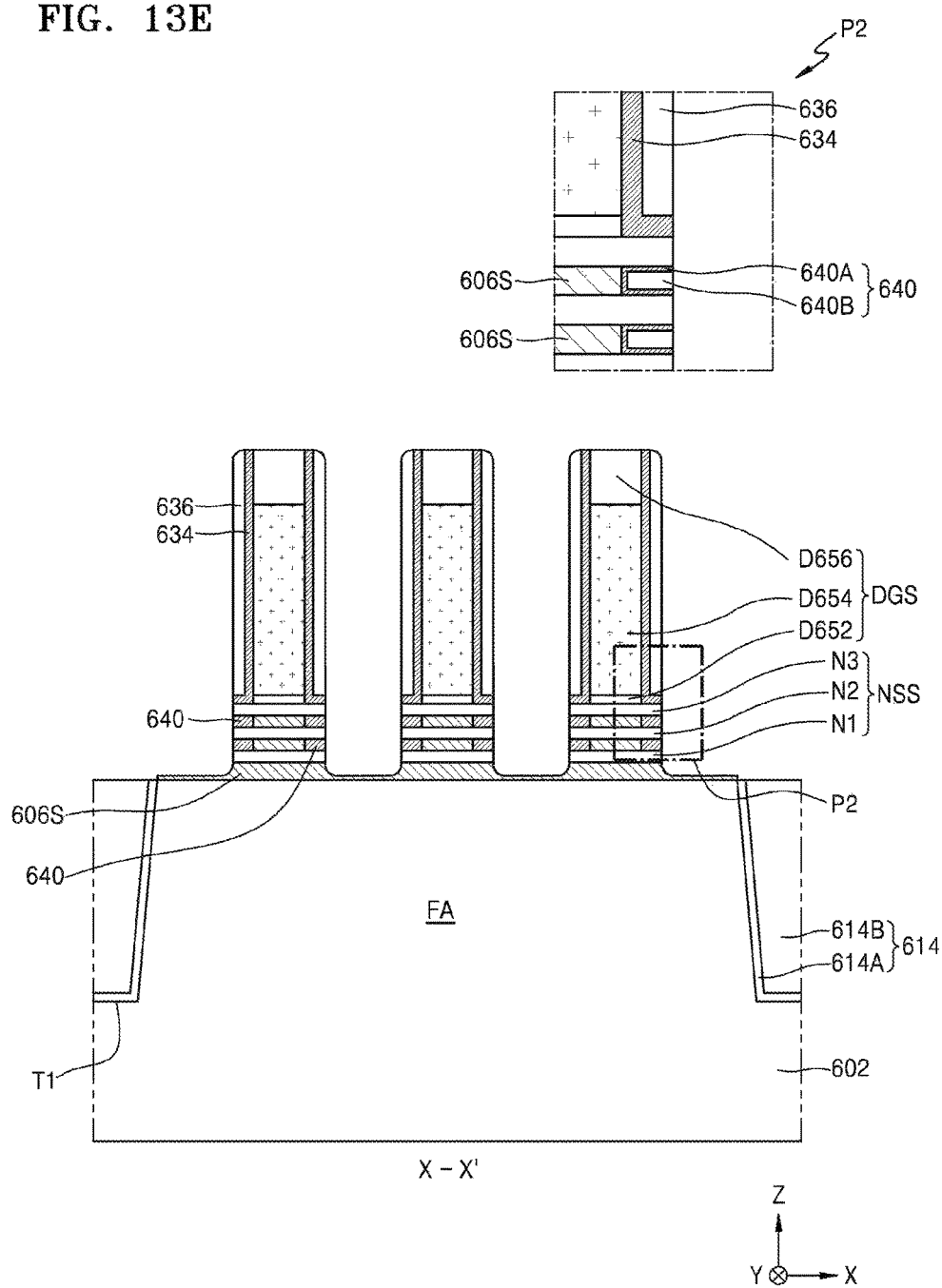

As shown in FIG. 13E, only a second insulating spacer 640 filling the recess region 606R (see FIG. 13C) remains by removing a portion of the insulating structure 640L (see FIG. 13D), which is outside the recess region 606R. The second insulating spacer 640 may have a multilayer structure, in which an inner width-setting pattern 640A and an inner insulating pattern 640B are stacked in this stated order.

In some exemplary implementations, the inner insulating pattern 640B may be removed and substituted with an air space in a subsequent process.

Both sidewalls of each of the nanosheets N1, N2, and N3, a plurality of second insulating spacers 640, and the lowermost sacrificial semiconductor layer 606S of the plurality of sacrificial semiconductor layers 606S may be exposed, after the portion of the insulating structure 640L shown in FIG. 13D is removed, the portion of the insulating structure 640L being outside the recess regions 606R (see FIG. 13C).

Figure 13F:
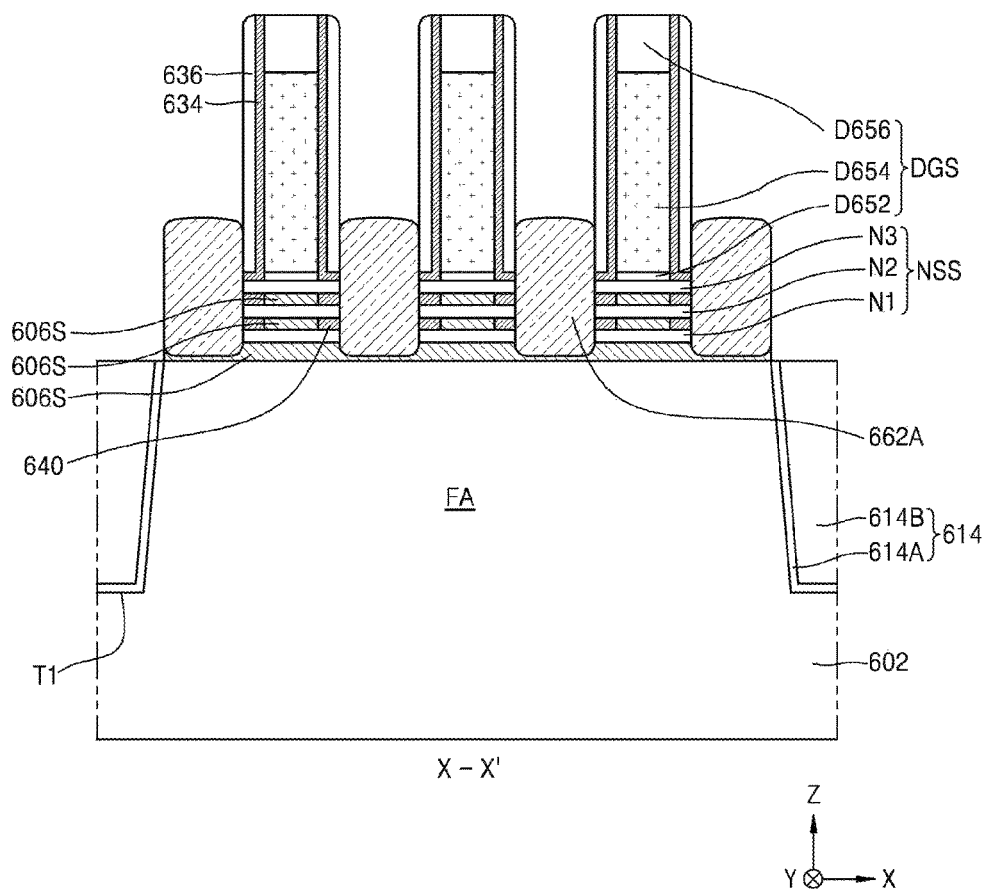

As shown in FIG. 13F, the exposed sidewalls of the plurality of nanosheets N1, N2, and N3, and an exposed surface of the lowermost sacrificial semiconductor layer 606S of the plurality of sacrificial semiconductor layers 606S are cleaned, thereby removing natural oxide layers from the exposed sidewalls of the plurality of nanosheets N1, N2, and N3 and the exposed surface of the lowermost sacrificial semiconductor layer 606S. Next, semiconductor layers 662A for forming source/drain regions 662 (see FIG. 10B) are formed by epitaxially growing a semiconductor material on the exposed sidewalls of the plurality of nanosheets N1, N2, and N3.

Figure 13G:
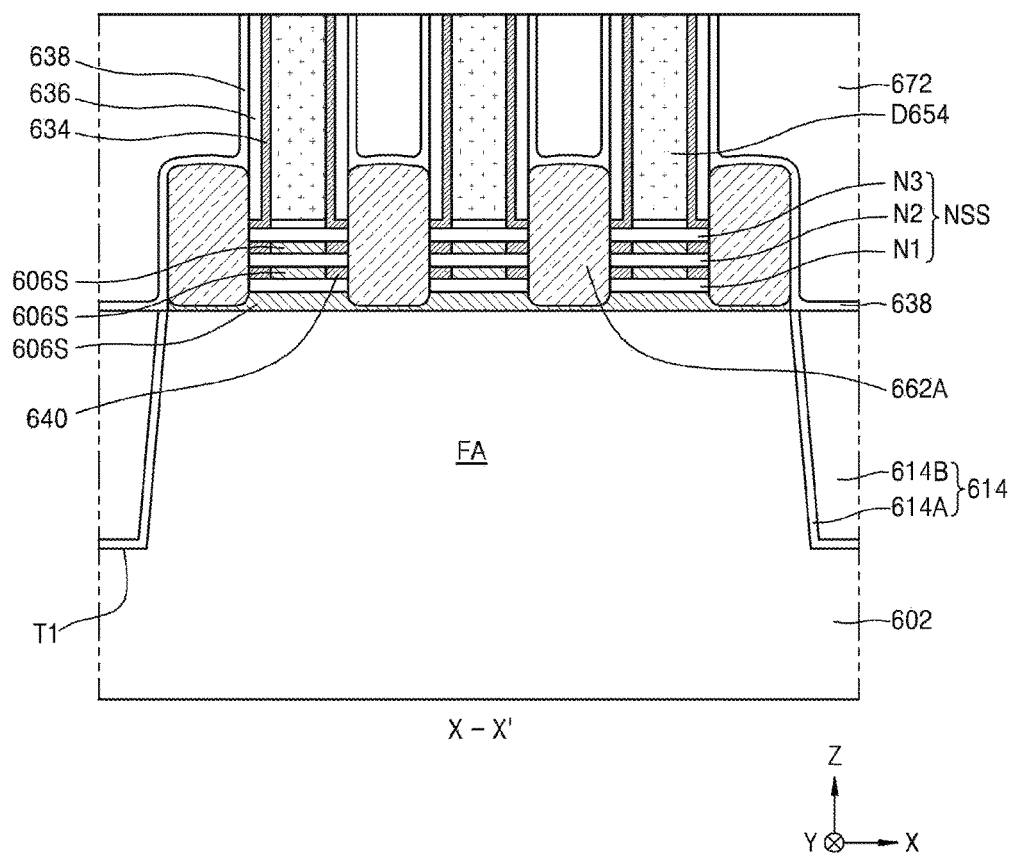

As shown in FIG. 13G, a protective layer 638 is formed to cover a result product including the semiconductor layers 662A, and an inter-gate dielectric 672 is formed on the protective layer 638. Next, a top surface of the capping layer D656 (see FIG. 13F) is exposed by planarizing the inter-gate dielectric 672, and etch-back of the capping layer D656, the width-setting patterns 634, the first insulating spacer 636, and the protective layer 638 is performed, the width-setting patterns 634, the first insulating spacer 636, and the protective layer 638 being in the vicinity of the capping layer D656. Next, an upper portion of the inter-gate dielectric 672 is polished as much as a certain thickness, whereby a top surface of the inter-gate dielectric 672 is at approximately the same level as a top surface of the dummy gate layer D654.

Figure 13H:
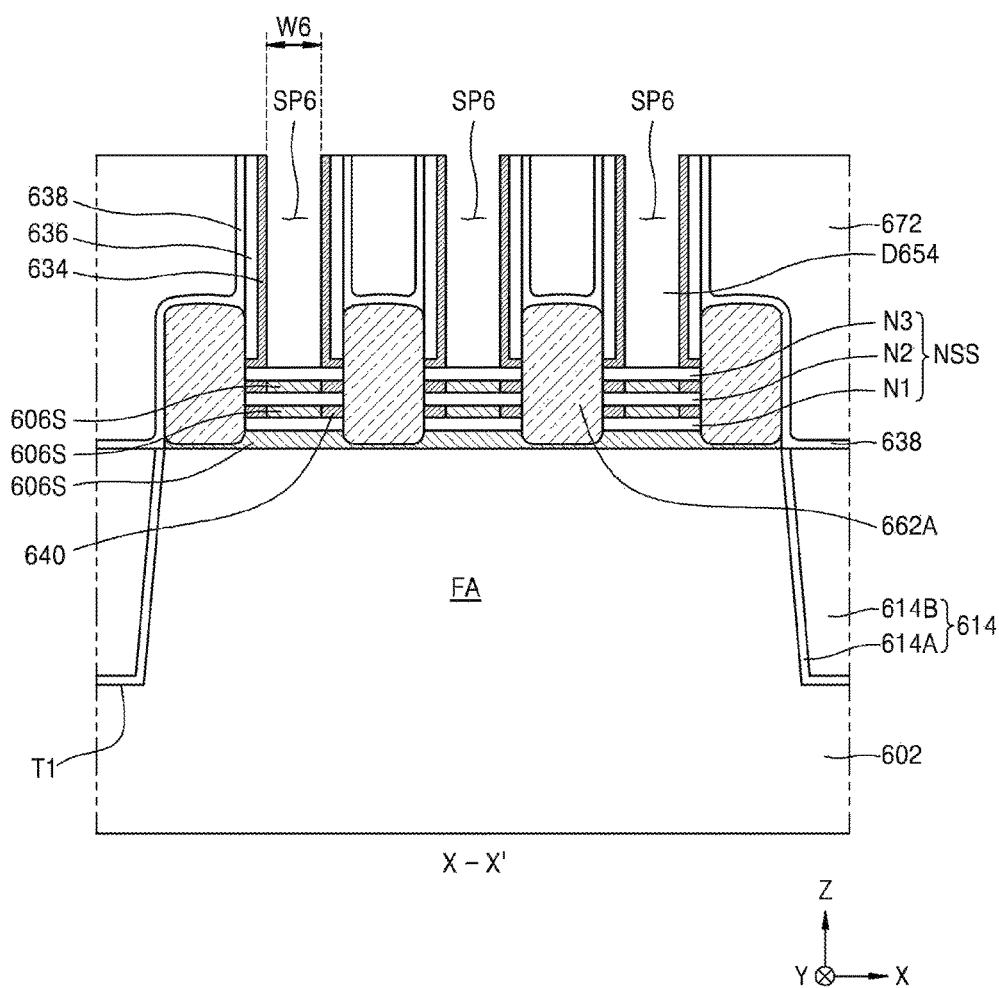

As shown in FIG. 13H, the dummy gate layer D654 is exposed by the inter-gate dielectric 672, and the oxide layer D652 under the dummy gate layer D654 being removed, thereby forming a gate structure space SP6. The width-setting patterns 634 and a nanosheet N3 may be exposed by the gate structure space SP6.

To remove the dummy gate layer D654 and the underlying oxide layer D652, a wet etching process may be used. During the wet etching process, a pair of width-setting patterns 634 defining a width W6 of the gate structure space SP6 may be exposed to an etching solution. Since the pair of width-setting patterns 634 include a material having a relatively high carbon content, the pair of width-setting patterns 634 have excellent resistance with respect to the etching solution. Therefore, even though exposed to the etching solution, the pair of width-setting patterns 634 may remain intact without the substantial consumption thereof by the etching solution. Therefore, the width W6 of the gate structure space SP6 may be maintained constant.

Figure 13I:
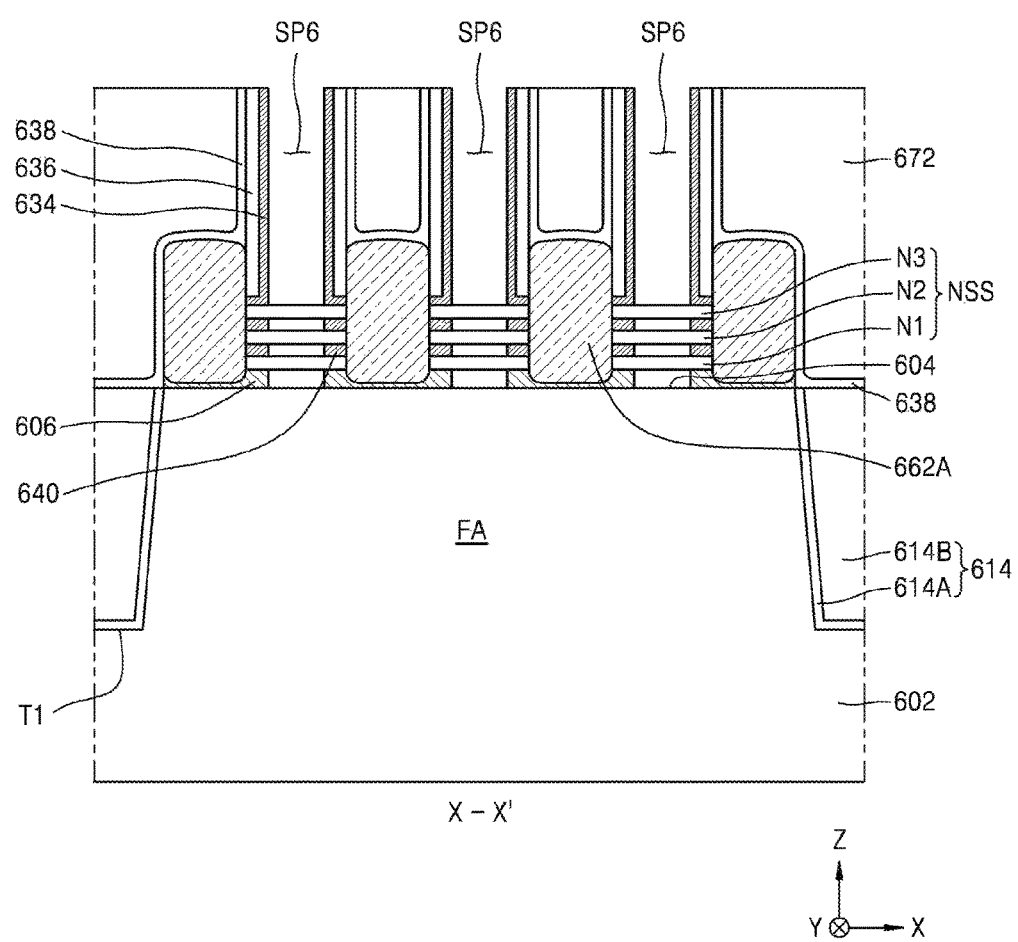

As shown in FIG. 13I, the plurality of sacrificial semiconductor layers 606S remaining on the fin-type active regions FA are partially removed through the gate structure space SP6, whereby the plurality of nanosheets N1, N2, and N3 and the top surfaces of the fin-type active regions FA are partially exposed by the gate structure space SP6.

The lowermost sacrificial semiconductor layer 606S of the plurality of sacrificial semiconductor layers 606S may not completely removed and may partially remain on the fin-type active regions FA and under the second insulating spacer 640. The remaining portion of the sacrificial semiconductor layers 606S on the fin-type active regions FA may constitute a buffer semiconductor layer 606.

To partially remove the plurality of sacrificial semiconductor layers 606S through the gate structure space SP6, a wet etching process may be used. During the wet etching process, the inner width-setting pattern 640A (see FIG. 13E) constituting the second insulating spacer 640 may be exposed to an etching solution. Since the inner width-setting pattern 640A includes a material having relatively high carbon content, the inner width-setting pattern 640A has excellent resistance with respect to the etching solution. Therefore, even though exposed to the etching solution, the inner width-setting pattern 640A may remain intact without the substantial consumption thereof by the etching solution. Therefore, lengths of sub-gate portions 650S along an X direction may be constantly controlled, the sub-gate portions 650S being interposed between the plurality of nanosheets N1, N2, and N3.

Figure 13J:
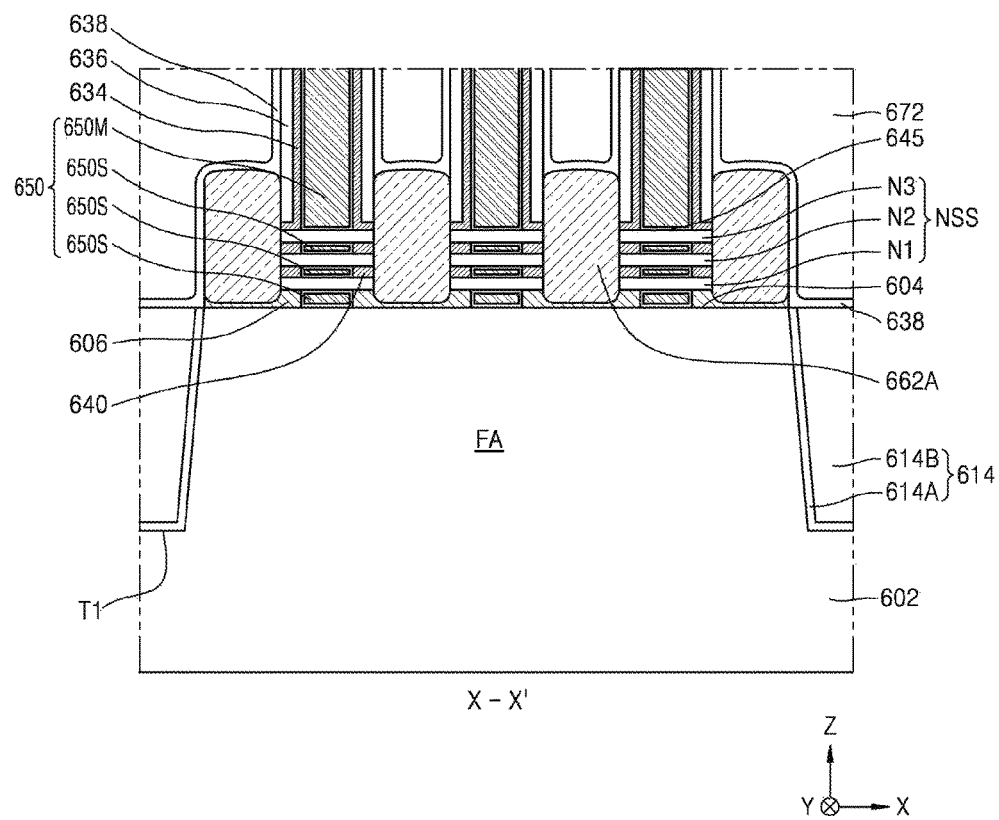

As shown in FIG. 13J, natural oxide layers are removed from exposed surfaces of the plurality of nanosheets N1, N2, and N3 and the fin-type active regions FA. Next, a gate insulating layer 645 is formed on exposed surfaces in the gate structure space SP6 (see FIG. 13I), and a gate 650 is formed on the gate insulating layer 645 and covers the inter-gate insulating layer 672 while filling the gate structure space SP6.

The gate 650 may include: a main gate portion 650M covering a top surface of each nanosheet stacked structure NSS including the plurality of nanosheets N1, N2, and N3; and a plurality of sub-gate portions 650S connected to the main gate portion 650M and located between the plurality of nanosheets N1, N2, and N3.

Next, as shown in FIG. 10B, an interlayer insulating layer 674 is formed to cover the gate 650 and the inter-gate insulating layer 672, followed by partially etching the gate 650 and the inter-gate insulating layer 672, thereby forming a plurality of contact holes exposing a plurality of semiconductor layers 662A. Next, metal silicide layers 662B are respectively formed on top surfaces of the plurality of semiconductor layers 662A exposed by the plurality of contact holes, and a plurality of contact plugs 690 are formed to be respectively connected to the semiconductor layers 662A through the metal silicide layers, thereby forming the integrated circuit device 600 shown in FIGS. 10A to 10C.

According to the method of fabricating the integrated circuit device, which has been described with reference to FIGS. 13A to 13I, the width-setting patterns 634 are formed on both sidewalls of the main gate portion 650M, and the inner width-setting pattern 640A constituting a portion of the second insulating spacer 640 is formed between the plurality of nanosheets N1, N2, and N3, whereby the width W6 of the space for forming the gate structure including the gate insulating layer 645 and the gate 650 may be constantly controlled. As a result, a length of the main gate portion 650M and a length of each of the sub-gate portions 650S along the X direction may be constantly controlled, the sub-gate portions 650S being formed between the plurality of nanosheets N1, N2, and N3.

According to the integrated circuit device 600 and the fabrication method thereof, which have been described with reference to FIGS. 10A to 13J, the integrated circuit device 600 includes the width-setting pattern 634 and the inner width-setting pattern 640A as well, the width-setting pattern 634 being formed on both sidewalls of the main gate portion 650M, and the inner width-setting pattern 640A being formed between the plurality of nanosheets N1, N2, and N3. However, one of the width-setting pattern 634 and the inner width-setting pattern 640 may be omitted without departing from the spirit and scope of the inventive concept.

Heretofore, although the integrated circuit devices 100, 200, 300, 400, 500, and 600 including FinFETs having 3-dimensional-structured channels and the fabrication methods thereof have been described with reference to FIGS. 1A to 13J, the inventive concept is not limited thereto. For example, it will be understood by those skilled in the art that integrated circuit devices including planar MOSFETs having the features according to the inventive concept and fabrication methods thereof may be provided by various modifications and changes of the inventive concept without departing from the spirit and scope of the inventive concept.

Figure 14:
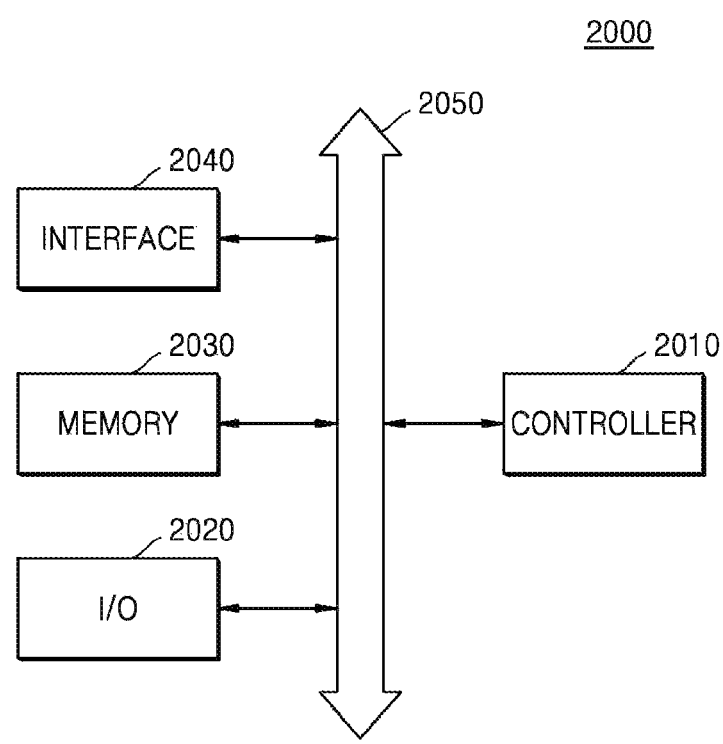
FIG. 14 is a block diagram of an electronic system according to exemplary implementations.

FIG. 14 is a block diagram of an electronic system 2000 according to exemplary implementations.

The electronic system 2000 includes a controller 2010, an input/output (I/O) device 2020, a memory 2030, and an interface 2040, and these components are connected to each other through a bus 2050.

The controller 2010 may include at least one of a microprocessor, a digital signal processor, and processors similar thereto. The input/output device 2020 may include at least one of a keypad, a keyboard, and a display. The memory 2030 may be used for storing a command executed by the controller 2010. For example, the memory 2030 may be used for storing user data.

The electronic system 2000 may constitute a wireless communication device, or a device capable of transmitting and/or receiving information in a wireless environment. In the electronic system 2000, to transmit/receive data through a wireless communication network, the interface 2040 may be configured as a wireless interface. The interface 2040 may include an antenna and/or a wireless transceiver. In some exemplary implementations, the electronic system 2000 may be used for a communication interface protocol of a 3rd-generation communication system, such as code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100, 200, 300, 400, 500, and 600 described with reference to FIGS. 1A to 13J and integrated circuit devices having various structures changed and modified therefrom without departing from the spirit and scope of the inventive concept.

While the inventive concept has been particularly shown and described with reference to exemplary implementations herein, it will be understood that various changes in form and details may be made therein without departing from the spirit and scope of the following claims.

What is claimed is:

1. An integrated circuit device comprising:
   a pair of width-setting patterns over a substrate, the pair of width-setting patterns defining a width of a gate structure space in a first direction and extending in a second direction intersecting with the first direction;
   a gate electrode layer extending in the gate structure space along the second direction;
   a gate insulating layer in the gate structure space and between the substrate and the gate electrode layer; and
   an insulating spacer on the pair of width-setting patterns, the insulating spacer covering both sidewalls of the gate electrode layer,
   wherein the pair of width-setting patterns have a carbon content that is greater than a carbon content of the insulating spacer, and
   wherein the insulating spacer comprises:
   a first carbon-containing insulating layer over the pair of width-setting patterns; and
   a silicon nitride layer on the pair of width-setting patterns and between the first carbon-containing insulating layer and the pair of width-setting patterns,
   wherein the first carbon-containing insulating layer having a first oxygen content, and
   wherein the pair of width-setting patterns comprise a second carbon-containing insulating layer having a second oxygen content that is less than the first oxygen content.

2. The integrated circuit device according to claim 1, wherein the gate electrode layer has a gate length in the first direction that is less than the width of the gate structure space along the first direction.

3. The integrated circuit device according to claim 1, wherein the gate electrode layer contacts the pair of width-setting patterns.

4. The integrated circuit device according to claim 1,
   wherein the first carbon-containing insulating layer has a first carbon content, and
   wherein the second carbon-containing insulating layer is spaced apart from the first carbon-containing insulating layer and has a second carbon content that is greater than the first carbon content.

5. The integrated circuit device according to claim 1,
   wherein the first carbon-containing insulating layer has a first carbon content selected from a range of 5 atom % to 15 atom %, and
   wherein the second carbon-containing insulating layer has a second carbon content selected from a range of 10 atom % to 25 atom % and is greater than the first carbon content.

6. The integrated circuit device according to claim 1, wherein at least one of the pair of width-setting patterns comprises a horizontally-extending portion facing a bottom surface of the insulating spacer.

7. The integrated circuit device according to claim 1, wherein at least one of the pair of width-setting patterns comprises:
   a horizontally-extending portion facing a bottom surface of the insulating spacer; and
   a vertically-extending portion facing one of opposing sidewalls of the gate electrode layer.

8. The integrated circuit device according to claim 1, wherein the pair of width-setting patterns have a carbon content selected from a range of 10 atom % to 25 atom % and comprise a SiOCN layer, a SiCN layer, or combinations thereof.

9. An integrated circuit device comprising:
   a fin-type active region protruding from a substrate and extending in a first direction;
   a device isolation layer covering a lower sidewall of the fin-type active region;
   a pair of width-setting patterns on the fin-type active region and the device isolation layer, the pair of width-setting patterns defining a width of a gate structure space in the first direction and extending in a second direction intersecting with the first direction;
   a gate electrode layer covering a top surface and both sidewalls of the fin-type active region and extending in the gate structure space along the second direction;
   a gate insulating layer in the gate structure space and between the fin-type active region and the gate electrode layer; and
   an insulating spacer on the pair of width-setting patterns, the insulating spacer covering both sidewalls of the gate electrode layer,
   wherein the pair of width-setting patterns have a carbon content that is greater than a carbon content of the insulating spacer, and
   wherein the insulating spacer comprises:
   a first carbon-containing insulating layer over the pair of width-setting patterns; and
   a silicon nitride layer on the pair of width-setting patterns and between the first carbon-containing insulating layer and the pair of width-setting patterns,
   wherein the first carbon-containing insulating layer having a first oxygen content, and
   wherein the pair of width-setting patterns comprise a second carbon-containing insulating layer having a second oxygen content that is less than the first oxygen content.

10. The integrated circuit device according to claim 9, wherein the first carbon-containing insulating layer has a first carbon content selected from a range of 5 atom % to 15 atom %, and
    wherein the second carbon-containing insulating layer has a second carbon content selected from a range of 10 atom % to 25 atom % and is greater than the first carbon content.

11. The integrated circuit device according to claim 9, wherein at least one of the pair of width-setting patterns comprises a horizontally-extending portion in the first direction, and
    the insulating spacer is spaced apart from the fin-type active region, with the horizontally-extending portion being interposed between the insulating spacer and the fin-type active region.

12. The integrated circuit device according to claim 9, wherein the insulating spacer is spaced apart from the fin-type active region, with the pair of width-setting patterns being interposed between the insulating spacer and the fin-type active region, the silicon nitride layer faces one of opposing sidewalls of the gate electrode layer, and the first carbon-containing insulating layer covers the silicon nitride layer.

13. The integrated circuit device according to claim 1, wherein the first carbon-containing insulating layer includes a SiOCN layer having the first oxygen content selected from a range of about 25 atom % to about 50 atom %, and the second carbon-containing insulating layer constituting the pair of width-setting patterns includes a SiOCN layer, a SiCN layer, or combinations thereof.

14. The integrated circuit device according to claim 9, wherein the first carbon-containing insulating layer includes a SiOCN layer having the first oxygen content selected from a range of about 25 atom % to about 50 atom %, and the second carbon-containing insulating layer constituting the pair of width-setting patterns includes a SiOCN layer, a SiCN layer, or combinations thereof.

* * * * *